(12) United States Patent
Uchiyama et al.

(10) Patent No.: US 9,837,543 B2
(45) Date of Patent: Dec. 5, 2017

(54) OXIDE SEMICONDUCTOR TARGET, OXIDE SEMICONDUCTOR FILM AND METHOD FOR PRODUCING SAME, AND THIN FILM TRANSISTOR

(71) Applicant: Hitachi Metals, LTD., Minato-ku, Tokyo (JP)

(72) Inventors: Hiroyuki Uchiyama, Yasugi (EP); Hideko Fukushima, Yasugi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 14/783,435

(22) PCT Filed: Apr. 10, 2014

(86) PCT No.: PCT/JP2014/060444
§ 371 (c)(1),
(2) Date: Oct. 9, 2015

(87) PCT Pub. No.: WO2014/168224
PCT Pub. Date: Oct. 16, 2014

(65) Prior Publication Data
US 2016/0035895 A1 Feb. 4, 2016

(30) Foreign Application Priority Data

Apr. 12, 2013 (JP) .................. 2013-084253

(51) Int. Cl.
*H01L 29/10* (2006.01)
*H01L 29/786* (2006.01)
(Continued)

(52) U.S. Cl.
CPC .......... *H01L 29/7869* (2013.01); *C23C 14/08* (2013.01); *C23C 14/086* (2013.01);
(Continued)

(58) Field of Classification Search
CPC .......... H01L 29/7869; H01L 21/02631; H01L 21/02565; H01L 21/02554; C23C 14/08; C23C 14/086; C23C 14/3414
(Continued)

(56) References Cited

U.S. PATENT DOCUMENTS

2013/0032798 A1* 2/2013 Miki ................ H01L 21/02422
257/43
2013/0334039 A1* 12/2013 Goto .................. C23C 14/3414
204/298.13

FOREIGN PATENT DOCUMENTS

JP          10-030172      *   2/1998
JP          H10-30172 A        2/1998
(Continued)

OTHER PUBLICATIONS

Kazushige Takechi and four others, Japanese Journal of Applied Physics, The Japan Society of Applied Physics, Jan. 20, 2009, vol. 48, p. 010203-1-3.
(Continued)

*Primary Examiner* — Phat X Cao
*Assistant Examiner* — Mohammad M Hoque
(74) *Attorney, Agent, or Firm* — SOLARIS Intellectual Property Group, PLLC

(57) ABSTRACT

The invention provides an oxide semiconductor target including an oxide sintered body including zinc, tin, oxygen, and aluminum in a content ratio of from 0.005% by mass to 0.2% by mass with respect to the total mass of the oxide sintered body, in which the content ratio of silicon to the total mass of the oxide sintered body is less than 0.03% by mass.

6 Claims, 19 Drawing Sheets

(51) Int. Cl.
*C23C 14/08* (2006.01)
*C23C 14/34* (2006.01)
*H01L 21/02* (2006.01)

(52) U.S. Cl.
CPC .... *C23C 14/3414* (2013.01); *H01L 21/02554* (2013.01); *H01L 21/02565* (2013.01); *H01L 21/02631* (2013.01)

(58) Field of Classification Search
USPC .......................................................... 257/43
See application file for complete search history.

(56) References Cited

FOREIGN PATENT DOCUMENTS

| JP | 2006-165532 A | 6/2006 |
|---|---|---|
| JP | 2010-37161 A | 2/2010 |
| JP | 2010037161 | * 2/2010 |
| JP | 2010-248547 A | 11/2010 |
| JP | 2012-33699 A | 2/2012 |
| JP | 2012-33854 A | 2/2012 |
| JP | 2012-180247 A | 9/2012 |

OTHER PUBLICATIONS

Toshio Kamiya and two others, Solid State Physics, AGNE Gijutsu Center Inc., Sep. 15, 2009, vol. 44, No. 9, p. 630-632.

P. Goerrn and three others, Applied Physics Letters, (United States), American Institute of Physics, Nov. 6, 2007, p. 193504-1-3.

English language translation of the following: Office action dated Nov. 22, 2016 from the SIPO in a Chinese patent application No. 201480020520.7 related to the instant patent application. This office action translation is submitted now in order to supplement the understanding of the cited reference which is being disclosed in the instant Information Disclosure Statement.

* cited by examiner (a)

(b)

(c)

(a)

(b)

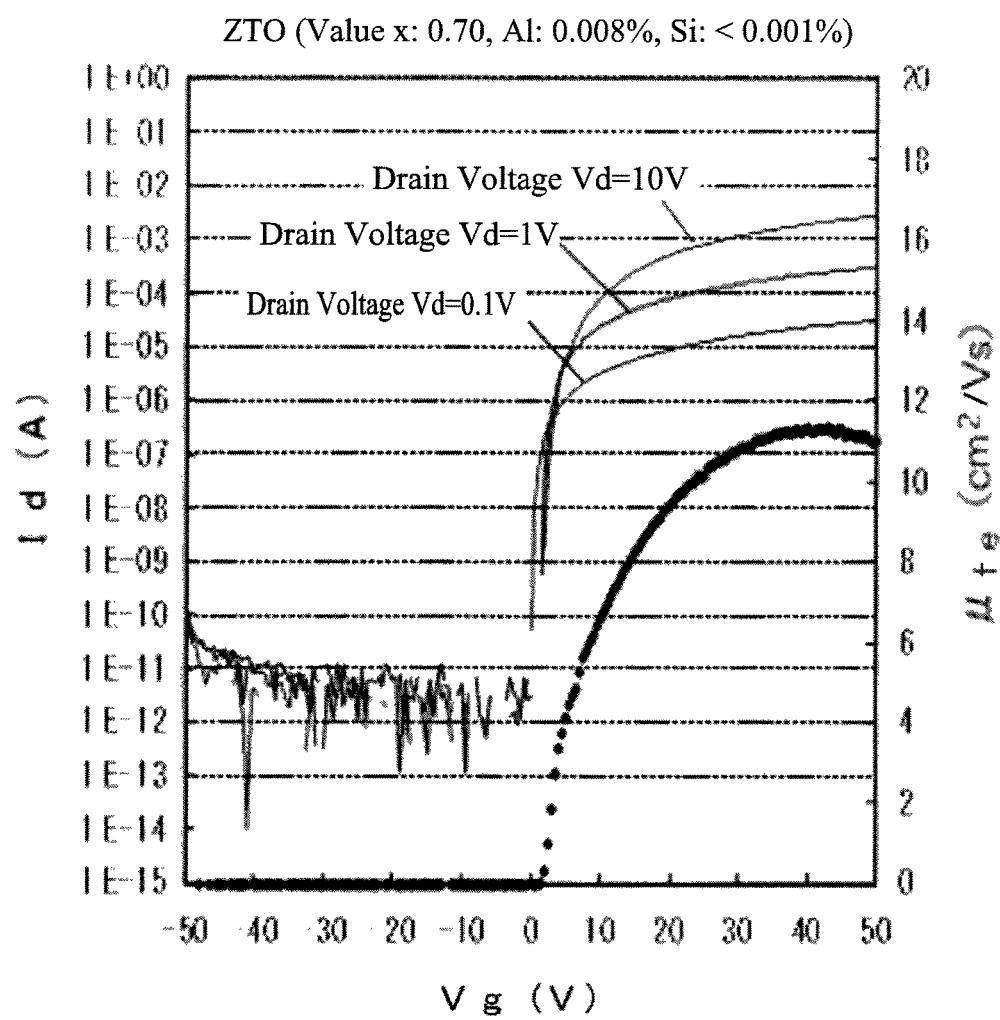

ZTO (Value x: 0.70, Al: 0.008%, Si: < 0.001%)

ZTO (Value x: 0.70, Al: 0.030%, Si: 0.004%)

ZTO (Value x: 0.70, Al: 0.095%, Si: 0.001%)

ZTO (Value x: 0.67, Al: 0.090%, Si: 0.030%)

ZTO (Value x: 0.67, Al: 0.090%, Si: 0.030%)

OXIDE SEMICONDUCTOR TARGET, OXIDE SEMICONDUCTOR FILM AND METHOD FOR PRODUCING SAME, AND THIN FILM TRANSISTOR

TECHNICAL FIELD

The invention relates to an oxide semiconductor target, an oxide semiconductor film and a method for producing the same, and a thin film transistor.

BACKGROUND ART

Liquid crystal displays in which amorphous silicon is used in a channel layer of a thin film transistor has been mainstream of liquid crystal displays driven by using thin film transistors. However, it is gradually becoming difficult for the channel layers formed with amorphous silicon to achieve high quality required for liquid crystal displays. Therefore, in recent years, oxide semiconductors have received much attention as alternative channel layer material to amorphous silicon.

Oxide semiconductors can be deposited to form films by the sputtering method, unlike amorphous silicon that is deposited to form films by the chemical vapor deposition method (CVD). Therefore, oxide semiconductors have excellent film uniformity, and have the potential that can deal with the desire for increasing the size and resolution of liquid crystal displays.

In addition, since oxide semiconductors have higher carrier mobility than that of amorphous silicon, oxide semiconductors are not only advantageous in terms of high-speed switching of images, but also can be expected to reduce power consumption (achieve power saving) since leakage current is extremely low during OFF state.

Furthermore, since the sputtering method enables formation of a film at a lower temperature than that in the chemical vapor deposition method, the sputtering method is advantageous in that it allows selection of materials having poor heat resistance as materials constituting thin film transistors.

Indium-gallium-zinc composite oxides (hereinafter, referred to as "IGZO") and zinc-tin composite oxides (hereinafter, referred to as "ZTO") are known as examples of oxide semiconductors suitable for channel layers of liquid crystal displays.

As techniques related to the foregoing, n-type thin film transistors using IGZO are disclosed (see, for example, Japanese Patent Application Laid-Open (JP-A) No. 2006-165532). Also, targets formed of a ZTO sintered body and oxide semiconductor films using the same are disclosed (see, for example, Japanese Patent Application Laid-Open (JP-A) No. 2010-37161, JP-A No. 2010-248547, and JP-A No. 2012-33699, and Toshio Kamiya and two others, Solid State Physics, AGNE Gijutsu Center Inc., Sep. 15, 2009, vol. 44, No. 9, p. 630-632).

Furthermore, it is known that oxide semiconductors such as IGZO and ZTO have a tendency that their properties as semiconductors deteriorate when exposed to light such as ultraviolet light, and that TFT characteristics thereof deteriorate when TFTs are prepared therefrom (see, for example, Kazushige Takechi and four others, Japanese Journal of Applied Physics, The Japan Society of Applied Physics, Jan. 20, 2009, vol. 48, p. 010203-1-3, and P. Goerrn and three others, Applied Physics Letters, (United States), American Institute of Physics, Nov. 6, 2007, p. 193504-1-3).

SUMMARY OF INVENTION

Technical Problem

Development for practical use of oxide semiconductor films, such as described above, has been actively carried out. However, when it is tried to manufacture liquid crystal displays using thin film transistors in which an oxide semiconductor film is used as a channel layer, the following problems arise due to the manufacturing processes.

(1) Resistance to Etching Solution

Method of manufacturing thin film transistors include a process of forming a channel layer formed of an oxide semiconductor film, followed by forming a conductive film formed of a metal, and etching the conductive film using an etching solution for the metal, thereby forming a source electrode and a drain electrode.

In this case, parts of the channel layer are brought into contact with the etching solution. Since IGZO dissolves in the etching solution for the metal at a rate comparable to that of the metal, it is not possible to selectively etch only the conductive film but allow the channel layer formed of IGZO to remain. As a measure thereto, it is proposed to provide an etch stop layer on the channel layer in order to prevent the channel layer from dissolving in the etching solution. However, providing the etch stop layer for the purpose of preventing the channel layer from dissolving leads to increase the manufacturing processes as compared with conventional liquid crystal displays in which amorphous silicon is used in a channel layers. The increase is not preferred in terms of process simplification and cost.

(2) Resistance to Light Irradiation

In a process of, for example, patterning a thin film transistor by photolithography or a process of forming an oriented film in which liquid crystal molecules are oriented in advance, there are cases in which a channel layer is irradiated with intense ultraviolet light. Also, during used as a liquid crystal display, visible light from a light source penetrates through the channel layer. Due to this, it is desirable that the characteristics of the thin film transistor do not change even when the channel layer formed of an oxide semiconductor film is irradiated with ultraviolet light or visible light.

However, it is known that when a thin film transistor in which an IGZO is used in a channel layer is irradiated with ultraviolet light, a threshold voltage for the generation of a drain current shifts toward negative voltage range, or the leakage current increases (see, for example, Japanese Journal of Applied Physics, Jan. 20, 2009, vol. 48, p. 010203-1-3 mentioned above). It is thought that reason therefor is that there is a deep level defect present in the bandgap in the band structure of IGZO, and the characteristics of the thin film transistor are affected by carriers generated through absorption of light in a range from ultraviolet light to visible light, which has lower photon energy than the photon energy corresponding to the bandgap of the deep level defect (for example, see Solid State Physics, Sep. 15, 2009, vol. 44, No. 9, p. 630-632 as mentioned above). Furthermore, it is reported that the decrease in threshold voltage for the generation of a drain current and the increase in leakage current in the thin film transistor observed upon the irradiation of light occurs also when a thin film transistor in which ZTO is used in the channel layer is irradiated with visible light (see, for example, Applied Physics Letters, Nov. 6, 2007, p. 193504-1-3 mentioned above)

When the threshold voltage for the generation of a drain current of the thin film transistor shifts toward negative voltage range, it becomes difficult to control switching of a pixel electrode connected to the thin film transistor. Also, when the leakage current increases, the power consumption of the liquid display increases. There are cases in which these phenomena are alleviated by performing annealing after light irradiation. However, there are many cases in which recovery effects are not obtained depending on the manufacturing process, such as after the formation of a protective film, and reliability of the thin film transistor is deteriorated when using the liquid crystal display. Also, in a liquid crystal display manufacturing process in which the above-mentioned oriented film is formed, the channel layer may be permanently damaged by irradiation of ultraviolet light having high intensity.

The invention has been made in view of the circumstances as described above, and aims to achieve the following objects. Specifically, a first object of the invention is to provide an oxide semiconductor target suitable for manufacturing an oxide semiconductor film having excellent resistance to an etching solution and light irradiation. A second object of the invention is to provide an oxide semiconductor film having an excellent resistance to an etching solution and light irradiation and a method of manufacturing the same. A third object of the invention is to provide a thin film transistor which displays a high resolution image without increasing the numbers of processes.

Solution to Problem

The invention has been made on the basis of the following finding. Specifically, the finding that inclusion of aluminum belonging to Group III in a predetermined amount in a target material including a zinc-tin composite oxide (ZTO), which is an oxide sintered body containing zinc, tin, and oxygen as main elements, enables selective etching of the conductive film only, and enables a generated film to have improved resistance to light irradiation.

Specific means for achieving the objects includes the following.

<1> An oxide semiconductor target including an oxide sintered body including zinc, tin, oxygen, and aluminum in a content ratio of 0.005% by mass to 0.2% by mass with respect to a total mass of the oxide sintered body, in which a content ratio of silicon to the total mass of the oxide sintered body is less than 0.03% by mass (including 0% by mass).

<2> The oxide semiconductor target according to the foregoing <1>, in which a ratio (Zn/(Zn+Sn)) of zinc to a total amount of zinc (Zn) and tin (Sn) is from more than 0.52 to 0.8 in terms of atomic ratio.

<3> The oxide semiconductor target according to the <1> or <2>, in which the oxide sintered body further includes silicon in a content in a range that does not exceed a content of aluminum, and a total content of aluminum and silicon is 0.1% by mass or less in terms of a content ratio to the total mass of the oxide sintered body.

<4> The oxide semiconductor target according to any one of the <1> to <3>, in which a content ratio of aluminum is from 0.005% by mass to 0.2% by mass with respect to the total mass of the oxide sintered body, and the content ratio of silicon is from 0.001% by mass to 0.02% by mass with respect to the total mass of the oxide sintered body.

<5> A method of manufacturing an oxide semiconductor film, the method including: forming an oxide semiconductor film on a substrate by a sputtering method using the oxide semiconductor target according to any one of the <1> to <4>.

<6> An oxide semiconductor film formed using the oxide semiconductor target according to any one of the <1> to <4>.

<7> A thin film transistor including a channel layer formed using the oxide semiconductor film of <6>, a change from a threshold voltage for generation of drain current before irradiation of light to a threshold voltage for generation of drain current after irradiation of light in the thin film transistor being from 0V to +2.0V.

<8> The thin film transistor according to the <7>, in which the change is from 0 V to +1.5 V.

Advantageous Effects of Invention

According to the invention, an oxide semiconductor target suitable for manufacturing an oxide semiconductor film having an excellent resistance to an etching solution and light irradiation is provided. Also, according to the invention, an oxide semiconductor film having an excellent resistance to an etching solution and light irradiation, and a manufacturing method thereof are provided. Furthermore, according to the invention, a thin film transistor displays a high resolution image without increasing the number of processes is provided.

BRIEF DESCRIPTION OF DRAWINGS

FIG. 4A illustrates Vg-Id characteristics of a thin film transistor sample including a ZTO film (Al=0.008% by mass) according to the invention before irradiation with ultraviolet light.

DESCRIPTION OF EMBODIMENTS

Figure 1:
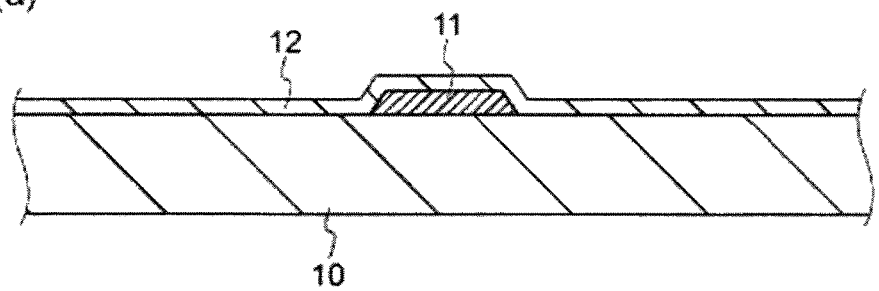
FIG. 1 is a process diagram for explaining a part of a manufacture example of manufacturing a thin film transistor in which an oxide semiconductor film is applied to a channel layer.
Figure 1:
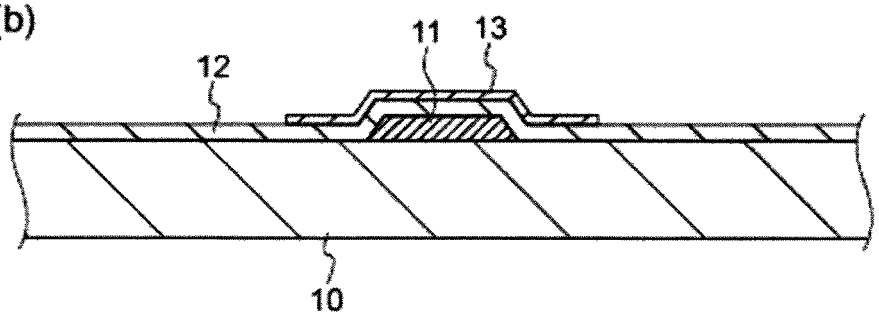
Figure 1:
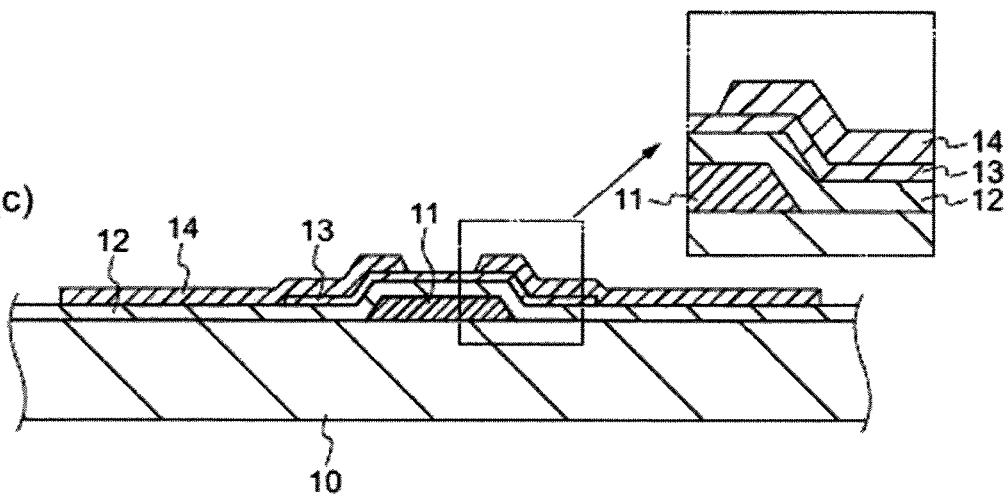

The oxide semiconductor target according to the invention will be described in detail below, together with detailed descriptions of an oxide semiconductor film formed using the oxide semiconductor target, a method of manufacturing the oxide semiconductor target, and a thin film transistor.

<Oxide Semiconductor Target>

The oxide semiconductor target according to the invention includes, as a component thereof, an oxide sintered body containing zinc, tin, oxygen, and aluminum in a content ratio of from 0.005% by mass to 0.2% by mass with respect to the total mass of the oxide sintered body. The oxide sintered body constituting the oxide semiconductor target according to the invention need not include silicon, but may further include silicon in a content ratio in the range of less than 0.03% by mass with respect to the total mass of the oxide sintered body. In addition, the oxide sintered body may further include an element or compound other than those described, if necessary. The element or compound other than those described above may be an inevitably element or compound coming from the raw materials or manufacturing processes.

In the case that the oxide semiconductor target according to the invention forms an oxide semiconductor film, the oxide semiconductor film has a suitable degree of resistance to dissolution in an etching solution that contacts the oxide semiconductor film during the formation of electrode or the like by etching, and has higher etching resistance than that of the electrode material or the like. In addition, the oxide semiconductor target according to the invention has excellent resistance to light irradiation, and deterioration of gate voltage (Vg)-drain current (Id) characteristics (hereinafter also abbreviated to "Vg-Id characteristics"), which tends to occur through the manufacturing processes, is also suppressed. For example, according to the invention, the shift of the threshold voltage for the generation of a drain current after light irradiation toward negative voltage range can be suppressed, and the shift toward the plus side also can be suppressed to be small.

Although the reason why the effects as described above are exerted is not completely clear, we suppose that the reason may be as follows. The oxide semiconductor target according to the invention includes, as a main component thereof, a zinc-tin composite oxide (ZTO), which is an oxide sintered body including zinc oxide and tin oxide. Since ZTO includes tin oxide having high resistance to etching, ZTO exhibits higher resistance to etching than that of IGZO, in the case of being made into an oxide semiconductor film. Therefore, for example, in a case in which a conductive film formed of a metal is formed on a channel layer including a ZTO, and in which the conductive film is etched to pattern wise form a source electrode and a drain electrode, etching selectively whereby only the conductive film is etched whereas the channel layer is not etched can be ensured.

In IGZO, there is a tendency toward an increase in carriers through absorption of, for example, ultraviolet light or visible light having a color in the range of violet to green. This optical responsiveness may cause a shift in the threshold voltage for the generation of a drain current or an increase in a leakage current, which results in a change in switching characteristics. For example, in a manufacturing process of a liquid crystal orientation film for orienting the liquid crystal molecules in advance, in a manufacturing process of a liquid crystal display, an orientation film is formed by intense ultraviolet light, and, at this time, characteristics of the thin film transistor significantly deteriorates. As described above, a similar change in switching characteristics also occurs in ZTO. In the invention, the carrier control effect of aluminum is sufficiently exerted and the extent of deterioration caused by light irradiation is effectively reduced, due to the inclusion of aluminum and adjustment of the content ratio thereof in a predetermined range that is neither excessively low, nor excessively high. In particular, a shift in the threshold voltage for the generation of a drain current toward negative voltage range, which is difficult to compensate for in the control of the thin film transistor, can be effectively suppressed, and a shift toward the plus side can also be suppressed to be a small. Further, the range of the shift can be controlled to be in the range from zero to +2.0 V (0 V or higher but not higher than +2.0 V), preferably in the range of zero to +1.5 V (0 V or higher but not higher than +1.5 V).

Due to this configuration, the oxide semiconductor target according to the invention has improved resistance to light irradiation and favorable switching characteristics while retaining resistance to etching as described above.

As used herein, the term "switching characteristics" refer to, for example, Vg-Id characteristics that indicate the relationship between the bias (Vg) applied to the gate electrode and the current value (Id) flowing through the drain electrode when the bias is changed.

The oxide sintered body in the oxide semiconductor target according to the invention may include zinc oxide and tin oxide in a total amount of 50% by mass or more in terms of mass ratio to the total amount of the oxide sintered body. The expression "zinc oxide and tin oxide in a total amount of 50% by mass or more" refers to inclusion of zinc oxide and tin oxide as a main component in the oxide sintered body. Inclusion of ZTO, which is composed of zinc, tin, and oxygen, as a main component dramatically improves the resistance to etching, as compared with IGZO.

In the oxide sintered body according to the invention, the ratio of zinc to the total amount of zinc (Zn) and tin (Sn) (Zn/(Zn+Sn)) is preferably from more than 0.52 to 0.8 in atomic ratio. When this ratio is represented by x, a value of x higher than 0.52 provides resistance to an etching solution that is not excessively strong, thereby making the etchability more favorable when the channel layer is formed into a desired pattern. A value of x of 0.8 or less enables maintenance of a favorable carrier mobility. A value of x in the range of from more than 0.52 to 0.8 provides a favorable balance between the ease of etching and the carrier mobility. A more preferable range for the value x is a range of 0.59 to 0.70.

In the case that the oxide sintered body includes zinc oxide (ZnO) and tin oxide ($SnO_2$) as a main component thereof, the main component is represented by $(ZnO)_x (SnO_2)_{1-x}$, and the value x indicating the ratio between ZnO and $SnO_2$ is preferably within the range described above.

The oxide sintered body constituting the oxide semiconductor target according to the invention includes aluminum (Al) as a trace element in an amount in the range of from 0.005% by mass to 0.2% by mass in terms of a content ratio to the total mass of the oxide sintered body. Inclusion of aluminum in a predetermined range that is neither excessively low nor excessively high enables control of carriers, and prevents deterioration when an oxide semiconductor film formed from the oxide semiconductor target is exposed to ultraviolet light or visible light. Accordingly, a change in Vg-Id characteristics caused by exposure to light is suppressed to be small.

When the content ratio of aluminum is less than 0.005% by mass and an oxide semiconductor film is formed, the effect of improving the resistance to light irradiation cannot be obtained, and Vg-Id characteristics cannot be stably maintained. When the content ratio of aluminum is higher than 0.2% by mass and an oxide semiconductor film is formed, the shift of the threshold voltage for the generation of a drain current tends to be large. When this shift is excessively large, it may be difficult to control the Vg-Id characteristics of the thin film transistor even when a correction circuit is used.

The content of aluminum in the oxide sintered body is preferably from 0.008% by mass to 0.1% by mass in terms of a content ratio to the total mass of the oxide sintered body, and more preferably from 0.008% by mass to 0.05% by mass, from the viewpoint that the suppression of the shift is further stabilized.

The oxide sintered body constituting the oxide semiconductor target according to the invention may further include other trace elements other than zinc, tin, oxygen, and aluminum. Examples of the trace elements include silicon. Besides silicon, examples of the trace elements include gallium (Ga), indium (In), tungsten (W), tantalum (Ta), hafnium (Hf), niobium (Nb), chromium (Cr), boron (B), vanadium (V), and iron (Fe) which are thought to possibly exert a similar type of effect to that exerted by aluminum; and germanium (Ge), lead (Pb), arsenic (As), antimony (Sb), and bismuth (Bi) which are thought to possibly exert a similar type of effect to that exerted by silicon. Furthermore, in addition to Fe, Pb, and Sb described above, there is a possibility that carbon (C), sulfur (S), phosphorus (P), nitrogen (N), hydrogen (H), magnesium (Mg), zirconium (Zr), manganese (Mn), cadmium (Cd), or the like coming from raw materials or manufacturing processes may be inevitably incorporated. The content ratio of other elements (including silicon) other than zinc, tin, oxygen, and aluminum is preferably regulated to be in the range of less than 0.03% by mass with respect to the total mass of the oxide sintered body, and more preferably regulated to be in the range that does not exceed the content of aluminum.

In particular, silicon is effective for improving sinterability and increasing the sintered density (relative density) of the oxide sintered body, but thought to affect the shift in the threshold voltage for the generation of a drain current. Therefore, the content of silicon is preferably in a range of less than 0.03% by mass in terms of a content ratio to the total mass of the oxide sintered body, and more preferably in a range that does not exceed the content of the aluminum. Inclusion of silicon at a content in the range that does not exceed the content of the aluminum enables weakening of the tendency that the shift in the threshold voltage for the generation of a drain current during light irradiation in the case of a low aluminum content is large, in an oxide semiconductor film formed from the oxide semiconductor target.

A greater content of silicon is more preferred for the improvement of sinterability. However, when the content ratio of silicon is 0.03% by mass or more, the shift in the threshold voltage for the generation of a drain current tends to increase for a reason that is not completely clear. In addition, as described below with reference to FIG. 11, the amount of the shift in the threshold voltage for the generation of a drain current varies depending on the oxygen addition condition at the time of deposition, even when the content ratio of aluminum is constant. Therefore, the content ratio of elements (including silicon) other than aluminum is preferably regulated to be less than 0.03% by mass so as to facilitate adjustment of the condition for deposition, to reduce sensitivity to influences from the variation in the deposition conditions, and to enhance practical utility. In particular, in the case of placing importance on the stability of the shift value of the threshold voltage for the generation of a drain current, the content ratio of silicon or trace elements (including silicon) other than aluminum to the total amount of the oxide sintered body is preferably 0.02% by mass or less, and more preferably 0.01% by mass or less.

In the technical field of semiconductors, inclusion of metal elements or metalloid atoms in large amounts in devices is unpreferred since the inclusion is a factor that causes unexpected risk due to so-called contamination. However, the risk due to contamination can be reduced in the case that the content of silicon or the content of trace elements (including silicon) other than aluminum is equal to or less than the amount of aluminum contained. Above all, from the viewpoint of improving resistance to light irradiation and avoiding of contamination, a case in which the amount of aluminum is 0.005% by mass to 0.2% by mass (50 ppm to 2000 ppm), and in which the amount of silicon is within the range of 0.001% by mass to 0.02% by mass (10 ppm to 200 ppm) is preferred.

In the oxide semiconductor target, the total content of contained aluminum and silicon, or the total content of contained aluminum and trace elements (including silicon) other than aluminum is preferably 0.1% by mass or less in terms of a content ratio to the total mass of the oxide sintered body, from the viewpoint that the shift in the threshold voltage for the generation of a drain current can be stably regulated to be within a preferred range (from 0 to +1.5 V), and is further preferably within the range of from 0.02% by mass to 0.1% by mass from the viewpoint that the shift in the threshold voltage for the generation can be regulated to be within a further preferred range (0 or more and +1.0 V or less).

The content of each of the constituent element, excluding oxygen in the oxide semiconductor target according to the invention can be obtained by analysis using a normal chemical analysis method, specifically, inductively-coupled plasma (ICP) emission spectrometry. The amount of oxygen corresponds to the balance.

The resistance to light irradiation of the characteristics of a thin film transistor in which the oxide semiconductor film formed using the oxide semiconductor target according to the invention is used as a channel layer dramatically improved as compared with not only the case of IGZO according to prior art but also the case of ZTO, which does not contain a predetermined amount of aluminum. Although the mechanism therefor is not clear, we presume that trace elements such as aluminum have an effect with respect to suppression of excess carriers generated by light irradiation.

The oxide semiconductor target according to the invention can be manufactured, for example, by mixing several types of zinc oxide (ZnO) powders and several types of tin (IV) oxide ($SnO_2$) powders in an appropriate combination as starting materials, the respective zinc oxide powers differing in the content of aluminum or the content of other elements including silicon, and molding and sintering the resultant mixture. The sintered density (relative density) of the oxide semiconductor target is preferably 90% or more, and more preferably 95% or more, in consideration of ease of handling and suppression of abnormal electrical discharge during deposition by a sputtering method. Also, the volume resistivity, also referred to as the specific resistivity, of the oxide semiconductor target is preferably 0.10 [$\Omega \cdot cm$] or less in consideration of, for example, DC discharge stability during deposition by a DC magnetron sputtering method.

<Oxide Semiconductor Film and Method of Manufacturing the Same>

The oxide semiconductor film according to the invention has an appropriate degree of resistance to an etching solution that contacts with the oxide semiconductor film during formation of electrodes or the like by etching, and has excellent etching workability during the formation of a channel layer, and also has resistance to light irradiation, and deterioration of Vg-Id characteristics thereof, which tends to occur through the manufacturing process, is also inhibited. This is because, as described above, it is thought that, since the oxide semiconductor film according to the invention is formed using the oxide semiconductor target according to the invention formed of a predetermined oxide sintered body, the oxide semiconductor film has a similar composition to that of the oxide sintered body, which includes zinc, tin, oxygen, and aluminum in a content ratio of 0.005% by mass to 0.2% by mass with respect to the total amount of the oxide sintered body. It is noted that it is difficult to actually make precise measurements of the contents of aluminum and other trace elements contained in the oxide semiconductor film.

The oxide semiconductor film according to the invention may be manufactured by any method as long as a film formed using the predetermined oxide semiconductor as described above can be formed using the method. Above all, the film is preferably manufactured by a method including forming an oxide semiconductor film by a sputtering method using the above described oxide semiconductor target according to the invention (the method of manufacturing the oxide semiconductor film according to the invention). Specifically, the oxide semiconductor film can be manufactured by attaching the oxide semiconductor target to a sputtering apparatus, and carrying out deposition on a substrate using a sputtering method. In this process, the deposition may be performed with the oxide semiconductor target attached to a backing plate.

As described above, forming an oxide semiconductor film using the oxide semiconductor target according to the invention including the predetermined oxide sintered body enables manufacture of an oxide semiconductor film is thought to include the same main components as those of the oxide semiconductor target, and also include the same trace elements as those in the oxide semiconductor target.

In another method of manufacturing an oxide semiconductor film, the film can be also manufactured by forming an oxide semiconductor film that does not include trace elements, including aluminum, other than zinc, tin, and oxygen, and thereafter supplying and diffusing predetermined amounts of trace elements into the surface of the oxide semiconductor by sputtering using target materials as supply sources for aluminum and other trace elements.

The method of manufacturing an oxide semiconductor film according to the invention will be specifically described referring to process (a) to process (c) illustrated in FIG. 1.

In process (a) illustrated in FIG. 1, a gate electrode 11 and a gate insulating film 12 are formed on a support substrate 10. Then, in process (b) illustrated in FIG. 1, a ZTO film is formed on the gate insulating film 12 using an RF magnetron sputtering method using the above-described oxide semiconductor target according to the invention, thereafter providing a resist pattern as a mask, and forming a channel layer 13 (zinc-tin composite oxide semiconductor film (ZTO film)) formed by etching of the ZTO film by a wet etching method using, for example, an oxalic acid-based etching solution or a hydrochloric acid-based etching solution. Thereafter, source and drain electrodes 14 are formed in process (c) illustrated in FIG. 1.

Figure 10A:
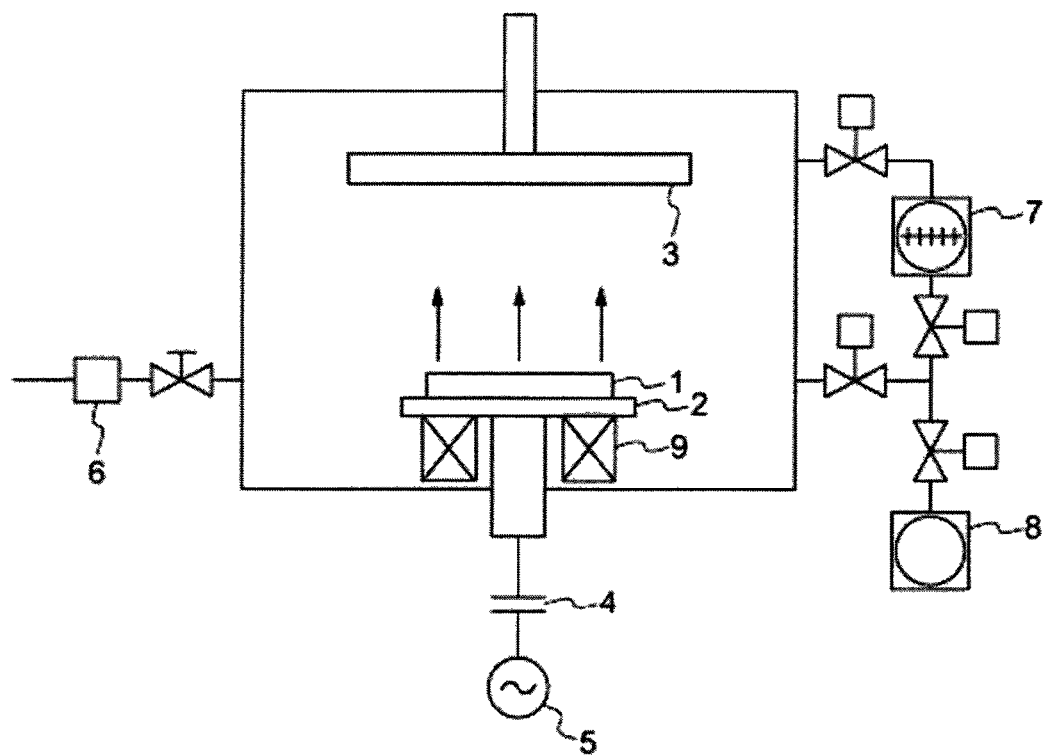
FIG. 10A is a schematic configuration diagram of an RF magnetron sputtering apparatus in which an oxide semiconductor target is used.
Figure 10B:
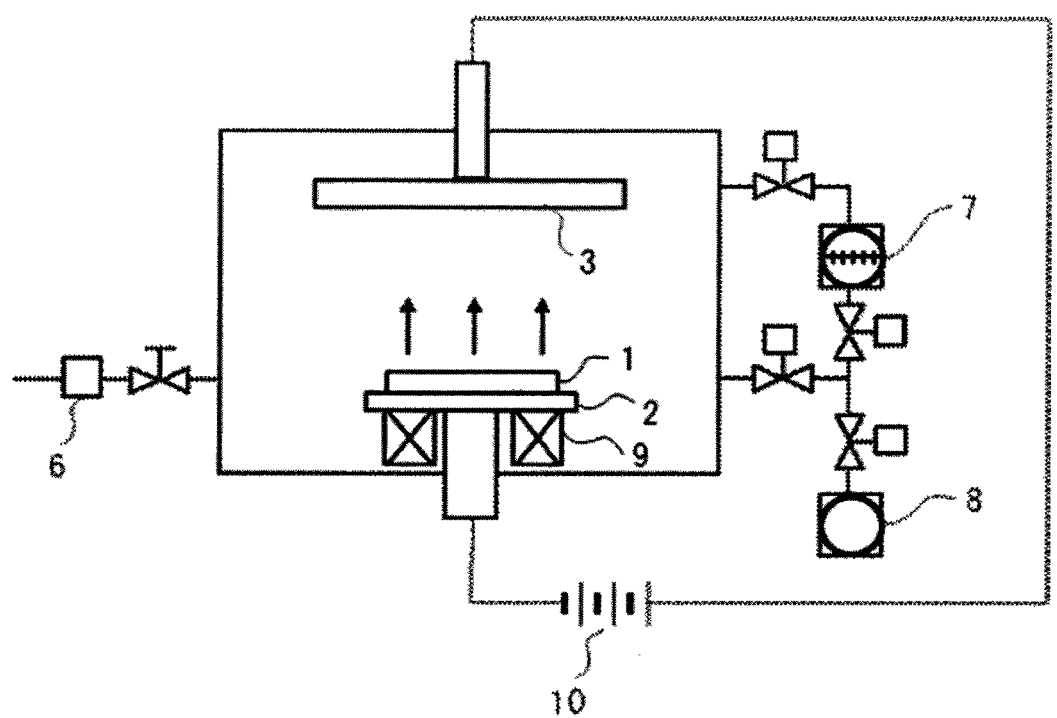
FIG. 10B is a schematic configuration diagram of a DC magnetron sputtering apparatus in which an oxide semiconductor target is used.

Using the oxide semiconductor target according to the invention, ZTO film can successively be formed by a DC bias or RF bias sputtering method, although there is an influence from, for example, the sintered density and volume resistivity thereof. FIG. 10A is a diagram illustrating a schematic configuration of an RF magnetron sputtering apparatus, and FIG. 10B is a diagram illustrating a schematic configuration of a DC magnetron sputtering apparatus. It is noted that in FIGS. 10A and 10B, reference numeral 1 indicates an oxide semiconductor target (ZTO target), reference numeral 2 indicates a cathode electrode (target back plate), reference numeral 3 indicates an opposed electrode (which also serves as a sample holder), reference numeral 4 indicates a matching box, reference numeral 5 indicates an RF power source, reference numeral 6 indicates a mass flow controller, reference numeral 7 indicates a cryopump or a turbo-molecular pump, reference numeral 8 indicates a dry pump or a rotary pump, reference numeral 9 indicates a magnet (for magnetron sputtering), and reference numeral 10 indicates a direct-current power source.

The oxide semiconductor film according to the invention may be formed by a sputtering method, for example, under the following conditions using an RF magnetron sputtering apparatus.

<Sputtering Condition>

Sputtering gas: argon (Ar) gas, oxygen gas, or a mixed gas thereof

Pressure: 0.1 Pa to 1.0 Pa

RF or DC power density: 0.5 $W/cm^2$ to 10 $W/cm^2$

Distance between electrodes: 40 mm to 100 mm

The channel layer 13 (zinc-tin composite oxide semiconductor film (ZTO film)) formed preferably has a thickness of from about 5 nm to about 75 nm, although a preferred thickness varies depending on the applied device. The ON state characteristics and reliability of a TFT can be improved by performing annealing treatment at from about 250° C. to about 300° C. after the deposition.

<Thin Film Transistor>

The thin film transistor according to the invention includes a channel layer formed using the oxide semiconductor film, and is configured such that a change from the threshold voltage for the generation of a drain current before light irradiation to the threshold voltage for the generation of a drain current after light irradiation is from 0 to +2.0 V.

Since the channel layer is formed using the above-described oxide semiconductor target according to the invention, the thin film transistor according to the invention has excellent etching resistance, inhibits deterioration of gate voltage (Vg)-drain current (Id) characteristics due to the influence of light to which the transistor is exposed in the manufacturing process and during use, and is able to retain and achieve favorable Vg-Id characteristics over a long period of time.

In the invention, as described above, the change in the threshold voltage for the generation is preferably from 0 V or more to +1.5 V, and more preferably from 0 V to +1.0 V.

The thin film transistor according to the invention may be manufactured by, for example, the following method.

First, the support substrate 10 is prepared as illustrated in process (a) of FIG. 1, and a metal thin film (for example, a multilayer film including aluminum (Al) and molybdenum (Mo) (Al/Mo multilayer film)) is formed on the support substrate 10 by a method such as a vapor deposition method or a sputtering method. Examples of the support substrate include a glass substrate, a quartz substrate, a sapphire substrate, a resin substrate, and a film.

Subsequently, the metal thin film formed is subjected to patterning by a lift-off process or an etching process, thereby forming the gate electrode 11. In a case in which the gate electrode is an Al/Mo laminated film, the thickness of the Al film is preferably, for example, 250 nm, and the thickness of the Mo film is preferably, for example, 50 nm. Next, the gate insulating film 12 having a thickness of about 100 nm and formed from, for example, an oxide film (for example, a silicon oxide film) or a nitride film (for example, a silicon nitride film) is deposited on the gate electrode by, for example, a sputtering method, a chemical vapor deposition method, or a vapor deposition method.

Subsequently, as described above, a ZTO film is formed on the gate insulating film 12 as illustrated in process (b) of FIG. 1 by an RF magnetron sputtering method in which the above-described oxide semiconductor target (ZTO target) according to the invention is used, and the ZTO film is thereafter processed to provide the channel layer 13.

Next, the source•drain electrode 14 is formed as illustrated in process (c) of FIG. 1. Subsequently, in process (a) illustrated in FIG. 2, a passivation film 15 is formed which covers the channel layer 13 and the source•drain electrode 14, followed by processing the passivation film 15 using a resist pattern as a mask to form connection holes 15a reaching the source•drain electrode 14.

Figure 2:
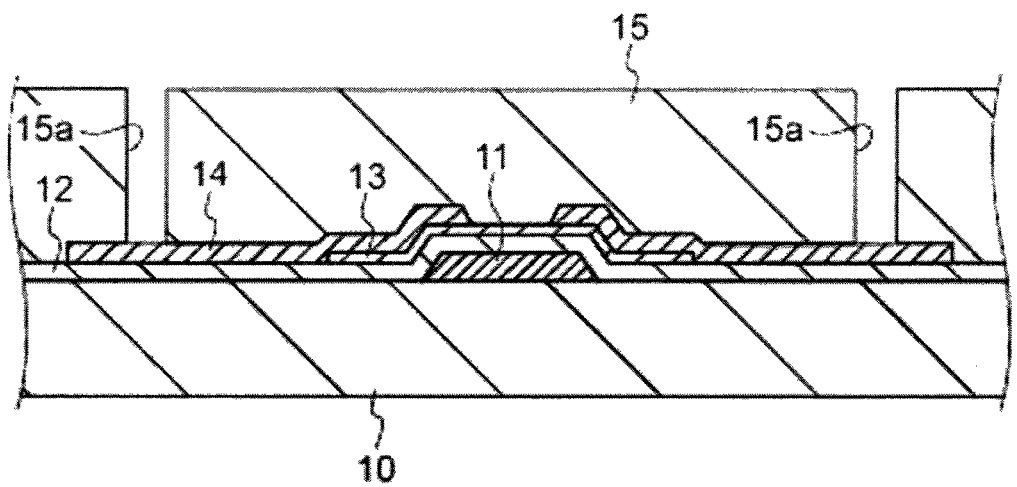
FIG. 2 is a process diagram for explaining a part of the manufacture example of manufacturing a thin film transistor in which an oxide semiconductor film is applied to a channel layer.
Figure 2:
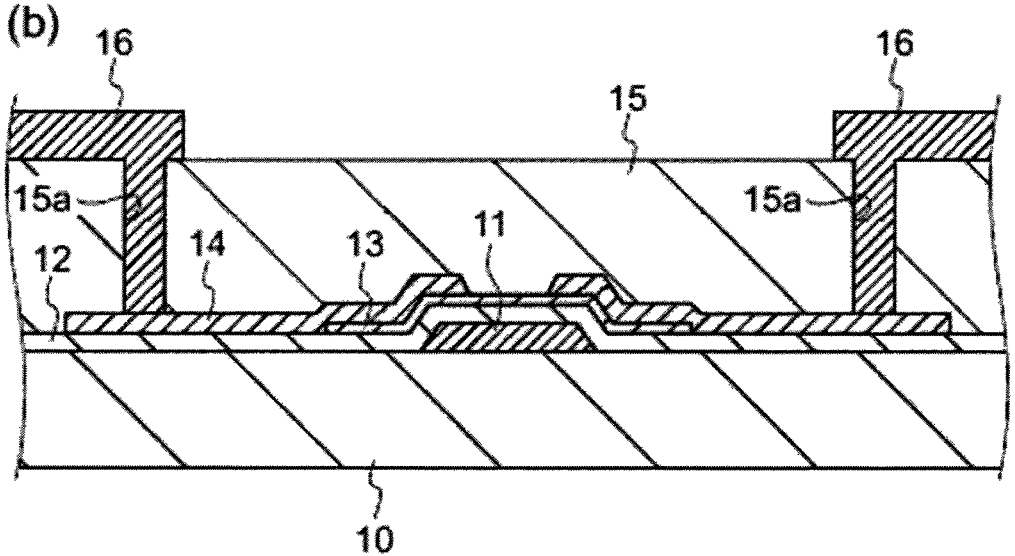

Then, in process (b) illustrated in FIG. 2, a conductor film is formed on the passivation film 15, including the inside of the connection holes 15a and processed into wiring 16 using a resist pattern as a mask. The conductor film may be a transparent conductive film such as, for example, an indium tin oxide (ITO) film, an indium zinc oxide (IZO) film, an aluminum zinc oxide (AZO) film, or a gallium zinc oxide (GZO) film, or a metal film such as an aluminum (Al) film, a molybdenum (Mo) film, or an alloyed film thereof, or a multilayer film (a Ti/Au multilayer film) including titanium (Ti) and gold (Au).

Through the manufacturing process as described above, a bottom-gate top-contact thin film transistor is completed.

EXAMPLES

Hereinafter, the invention will be further specifically described with reference to examples. However, the invention is not limited to the following examples as long as the spirit of the invention is retained.

Example 1

<1-1 Preparation of Target Material>

A highly-pure zinc oxide (ZnO) powder (ZnO powder) to which trace elements such as Al and Si are not intentionally added and a tin (IV) oxide ($SnO_2$) powder ($SnO_2$ powder) were prepared. The ZnO powder and the $SnO_2$ powder were mixed such that the ratio of Zn to Sn was set to satisfy a ratio of x=0.33, 0.52, 0.59, or 0.68 when ZnO and $SnO_2$ were used to provide an oxide sintered body [$(ZnO)_x(SnO_2)_{1-x}$], followed by molding and sintering, whereby four kinds of ZTO target materials (Nos. 1, 2, 3, and 4) having a diameter of 50.8 mm and a thickness of 5.0 mm were obtained.

As comparative samples, an IGZO target material (No. 5) having a diameter of 50.8 mm and a thickness of 5.0 mm and having a stoichiometric composition of $InGaZnO_4$, a pure-molybdenum target material (No. 6) having the same size, and a pure-aluminum target material (No. 7) having the same size were prepared.

<1-2 Preparation of Thin Film Sample>

The seven kinds of target materials (Nos. 1 to 7) prepared as described above were attached to a backing plate, and set in a magnetron sputtering apparatus (E-200S, manufactured by CANON ANELVA CORPORATION), and a thin film having a thickness of 500 mm was formed on a glass substrate, thereby preparing seven kinds of samples 1 to 7 corresponding to the respective target materials (Nos. 1 to 7).

<1-3 Evaluation 1>

A. Processability with Etching Solution for Transparent Conductive Film

The thin film samples 1 to 4 were measured with respect to film thickness after the thin film samples were immersed in a commercially available oxalic acid-based ITO etching solution (manufactured by KANTO CHEMICAL CO., INC.) for a predetermined period of time, and an etching rate was determined based on a change in film thickness determined from the thickness before and after the immersion. The results are illustrated in Table 1 below.

TABLE 1

| Thin Film Sample No. | Composition of Target Material (Zn:Sn = x:1 − x) Value x | Etching Rate (nm/min) |
|---|---|---|
| 1 | 0.33 | 1 |
| 2 | 0.52 | 1 |
| 3 | 0.59 | 3 |
| 4 | 0.68 | 9 |

As demonstrated in Table 1, each of the four kinds of thin film samples of ZTO exhibited an etching rate as low as less than 10 nm/min, but, had a favorable cross-sectional shape, and appropriate degree of processability with the etching solution. Considering that the production efficiency is thought to decrease when the etching rate is excessively low, thin film samples 3 to 4 in which the value x was higher than 0.52, that is, the target materials Nos. 3 and 4, are considered more favorable. It is noted that while a typical etching solution was used as the above etching solution, other etching solutions are also usable as long as the etching solutions are capable of favorably etching a ZTO material.

B. Resistance to Etching Solution for Metal Electrode

Next, using thin film sample 3 described above as a representative sample of the above ZTO thin film samples, and thin film samples 5 to 7 described above as samples to be compared therewith, the film state was observed when the samples have been immersed for a predetermined period of time in a commercially available phosphoric acid and sulfonic acid-based copper etching solution (catalog code Cu-03, manufactured by KANTO CHEMICAL CO., INC.); further, the film thickness as measured after the immersion, and an etching rate was obtained based on a change in film thickness determined from the film thickness before and after the immersion. The results are illustrated in Table 2 below.

TABLE 2

| Thin Film Sample No. | Target Material | Etching Rate (nm/min]) |
|---|---|---|
| 3 | ZTO (Value x = 0.59) | 0.27 |
| 5 | IGZO | 102 |
| 6 | Pure Molybdenum | 100 |
| 7 | Pure Aluminium | 80 |

As demonstrated in Table 2, the etching rate of the thin film sample 5 (IGZO) was not greatly different from the etching rates of the thin film sample 6 (molybdenum) or thin film sample 7 (aluminum).

In contrast, the etching rate of thin film sample 3 (ZTO) was extremely low (0.27 nm/min). The film thickness of thin film sample 3 exhibited no change even after immersion for 6 hours, whereas thin film sample 5 exhibited complete disappearance of the thin film in 5 minutes.

As above described, the oxide semiconductor film prepared using the ZTO target material according to the invention has dramatically higher resistance to an etching solution for metal electrode formation, as compared with conventional IGZO films and the like. Due to this, in a case in which the ZTO is adopted for the channel layer, metal electrodes such as a gate electrode and a drain electrode in a predetermined pattern can selectively be provided by etching without providing an etching stop film on the channel layer.

Example 2

<2-1 Preparation of Target Material>

In view of the result mentioned above, target materials for ZTO having high resistance to an etching solution for electrodes were prepared while varying the elements included therein, in order to evaluate resistance to light irradiation with varied included elements. Specifically, the following were performed.

A powder of highly-pure zinc oxide (ZnO) (ZnO powder) to which trace elements such as Al and Si were not intentionally added and a powder of tin (IV) oxide ($SnO_2$) ($SnO_2$ powder) were prepared. The ZnO powder and the $SnO_2$ powder were mixed such that the ratio of Zn to Sn set to satisfy x=0.60 when the ZnO and the $SnO_2$ were used to provide an oxide sintered body $[(ZnO)_x(SnO_2)_{1-x}]$, followed by molding and sintering, whereby a ZTO target material (No. 8) having a diameter of 50.8 mm and a thickness of 5.0 mm was obtained.

Subsequently, several kinds of powders of zinc oxide (ZnO) (ZnO powders) and several kinds of powders of tin (IV) oxide ($SnO_2$) ($SnO_2$ powders), having different contents of trace elements such as Al and Si, were prepared. Then, the ZnO powders and the $SnO_2$ powders were mixed in appropriate combinations such that the ratio of Zn to Sn satisfies x=0.67 or 0.70 when ZnO and $SnO_2$ were used to obtain an oxide sintered body $[(ZnO)_x(SnO_2)_{1-x}]$, followed by molding and sintering, whereby six kinds of ZTO target materials (Nos. 9 to 14) having a diameter of 50.8 mm and a thickness of 5.0 mm were obtained.

<2-2 Evaluation 2>

A. Analysis of Contained Elements

A part of each of the target materials No. 8 and Nos. 9 to 14 obtained as described was cut off to provide a sample for analysis, and the contents of zinc, (Zn), tin (Sn), and elements contained in trace amount in each target material was analyzed by inductively-coupled plasma emission spectrometry. The obtained analysis values for zinc and tin were converted to the ZnO—$SnO_2$ ratio x (atomic ratio) in the oxide sintered body $[(ZnO)_x(SnO_2)_{1-x}]$ and the x values are as indicated below. The obtained analysis values (% by mass; contents) of the trace elements are illustrated in Table 3 below.

Target material No. 8: x=0.60
Target material No. 9: x=0.70
Target material No. 10: x=0.70
Target material No. 11: x=0.70
Target material No. 12: x=0.70
Target material No. 13: x=0.67
Target material No. 14: x=0.67

TABLE 3

| Target Material No. | Al | Si | Al + Si | Fe | Pb | Sb | Cd | Remarks |
|---|---|---|---|---|---|---|---|---|
| 8 | 0.001 | 0.004 | 0.005 | — | — | — | — | Comparative Example |
| 9 | 0.008 | <0.001 | 0.008 | 0.001 | — | — | <0.001 | Example |
| 10 | 0.022 | 0.003 | 0.025 | — | — | — | — | Example |
| 11 | 0.03 | 0.004 | 0.034 | <0.001 | <0.001 | <0.001 | <0.001 | Example |
| 12 | 0.095 | <0.001 | 0.095 | — | — | — | — | Example |
| 13 | 0.09 | 0.03 | 0.12 | — | — | — | — | Comparative Example |
| 14 | 0.17 | 0.001 | 0.171 | — | — | — | — | Example |

*"<0.001" indicates a detection limit (rounded off to three decimal places)

B. Change in Threshold Value of Vg-Id Characteristics

In addition to the above-mentioned target materials No. 8 and Nos. 9 to 14, and the above-mentioned target material No. 5 having a stoichiometric composition of InGaZnO$_4$ as a comparative sample was prepared. Thin film transistor samples 5, 8, and 9 to 14 using the target materials No. 5, No. 8, and Nos. 9 to 14 in the manner described below.

As illustrated in process (a) of FIG. 1, a metal film was formed on the support substrate 10 that is a glass substrate by, for example, a sputtering method, and this metal film was subjected to patterning by an etching process, to obtain the gate electrode 11. Then, the gate insulating film 12 was deposited on this gate electrode by, for example, a chemical vapor deposition method. Next, the eight kinds of target materials (No. 5, No. 8, and Nos. 9 to 14) prepared were respectively and sequentially attached to backing plates, and set in an RF magnetron sputtering apparatus (E-200S, manufactured by CANON ANELVA CORPORATION). Through an ordinary process, an IGZO film or a ZTO film having a thickness of 300 nm corresponding to each target material (No. 5, No. 8, and Nos. 9 to 14) was formed on the gate insulating film 12 as illustrated in process (b) of FIG. 1. Also, the target materials No. 12 and No. 14 were set in a DC magnetron sputtering apparatus, and ZTO films were formed.

Subsequently, with a resist pattern as a mask, the IGZO film or ZTO film was processed by a wet etching method with an oxalic acid-based etching solution or a hydrochloric acid-based etching solution, thereby forming the channel layer 13. Next, as illustrated in process (c) of FIG. 1, a conductor film was formed on the channel layer 13 by, for example, a sputtering method, and the conductor film was thereafter subjected to pattering by, for example, an etching process, to form the source and drain electrodes 14.

Next, the passivation film 15 covering the channel layer 13 and the source and drain electrodes 14 were formed as illustrated in process (a) of FIG. 2. Subsequently, the passivation film 15 was processed using a resist pattern as a mask to form the connection holes 15a reaching the source and drain electrodes 14, and an ITO (Indium Tin Oxide) film was formed on the passivation film 15, including the inside of the connection holes 15a, as illustrated in process (b) of FIG. 2. Then, the ITO film was processed to form the wiring 16 using a resist pattern as a mask.

In this way, bottom-gate top-contact thin film transistor samples 5, 8, and 9 to 14 were prepared. The dimensions of the thin film transistors prepared were 100 μm in gate length and 2.0 mm in gate width, and the thickness of the channel layer was 30 nm.

The thin film transistor samples obtained were set in a prober, and voltage-current characteristics (Vg-Id characteristics) of each of thin film transistor samples 5, 8, and 9 to 14 were measured. The measurement was made by measuring a change in drain current (Id) when the gate voltage was changed in the range of −50 V to +50 V under three conditions with a drain voltage (Vd) of 0.1 V, 1 V, and 10 V, respectively. Further, a graph with its horizontal axis representing the gate voltage on a regular scale, and its vertical axis at the left representing the drain current on a common logarithm scale was drawn, and the value of the gate voltage at which the drain current dramatically increased when the gate voltage was changed was regarded as the threshold value of the Vg-Id characteristics (the threshold voltage for the generation of a drain current).

The Vg-Id characteristics of the thin film transistor samples 8 and 9 to 13 including the ZTO films obtained from the target materials No. 8 and Nos. 9 to 13 are illustrated in this order in FIG. 3A, FIG. 4A, FIG. 5A, FIG. 6A, FIG. 7A, and FIG. 8A. Also, the Vg-Id characteristics of the thin film transistor sample 5 including the IGZO film obtained from the target material No. 5 are illustrated in FIG. 9A. In the figures, each of the thin film transistor samples exhibited generally favorable Vg-Id characteristics. It is noted that plotting with large dots in the figures are plotting of the mobility ($\mu_{fe}$) as converted from the drain current using a scale along the vertical axis at the right for the purpose of reference.

Next, each thin film transistor was removed from the prober, and the surface on which the ZTO film or IGZO film was formed was irradiated with ultraviolet light. The ultraviolet light irradiation was carried out under the following conditions using a mercury lamp having a center wavelength of 254 nm.

<Irradiation Conditions>
Output: 20 to 30 mW/cm$^2$
Irradiation Time: 30 minutes, 1 hour After the ultraviolet light irradiation, the thin film transistor samples were again set in the prober, and Vg-Id characteristics of each sample was measured. The change in the threshold voltage for the generation of a drain current before the ultraviolet irradiation to after the ultraviolet irradiation is illustrated in Table 4 below. Also, the Vg-Id characteristics of thin film transistor samples 8 to 13 and sample 5 after the ultraviolet light irradiation are illustrated in this order in Figure. FIG. 3B, FIG. 4B, FIG. 5B, FIG. 6B, FIG. 7B, FIG. 8B, and FIG. 9B.

TABLE 4

Figure 3A:
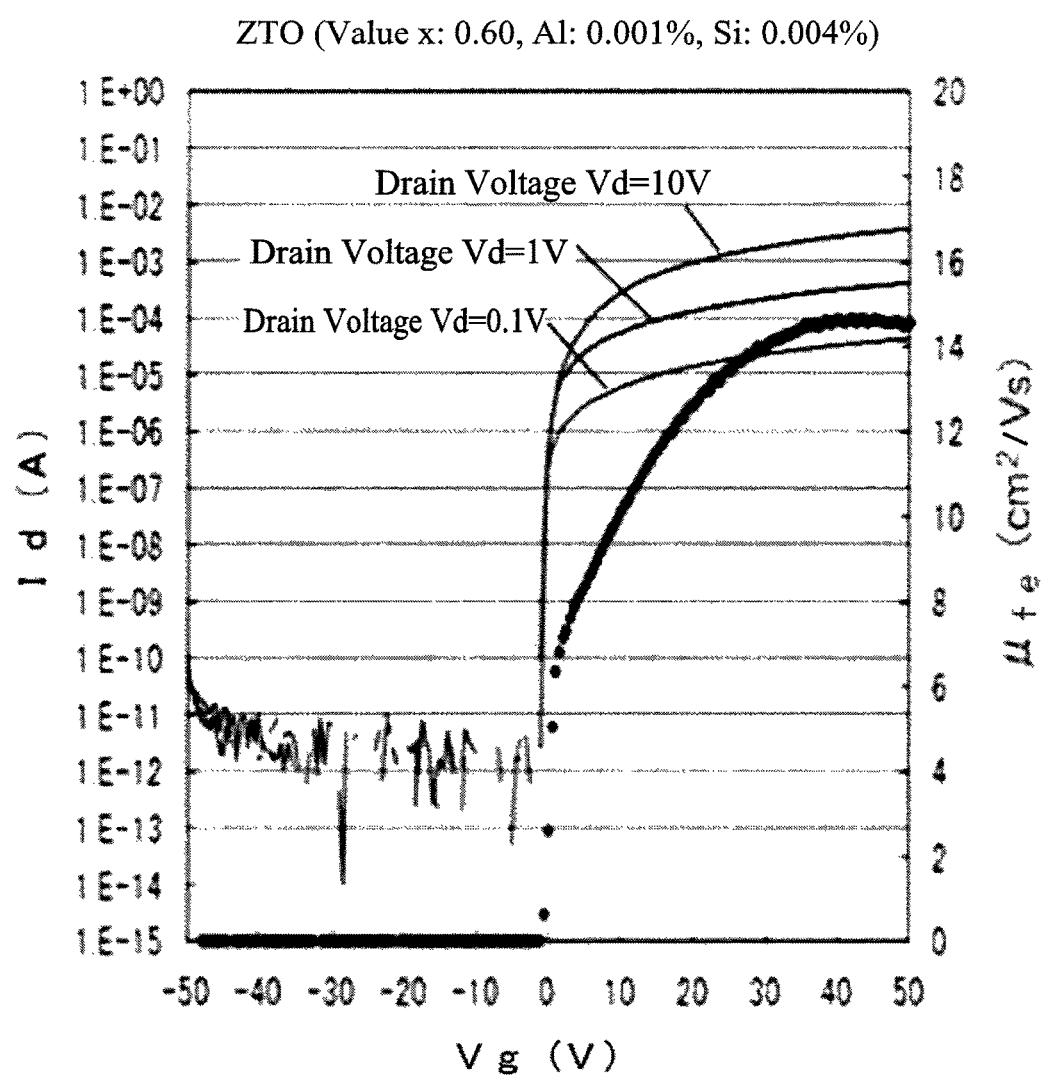
FIG. 3A illustrates Vg-Id characteristics of a thin film transistor sample including a comparative ZTO film (Al=0.001% by mass) before irradiation with ultraviolet light.
Figure 3B:
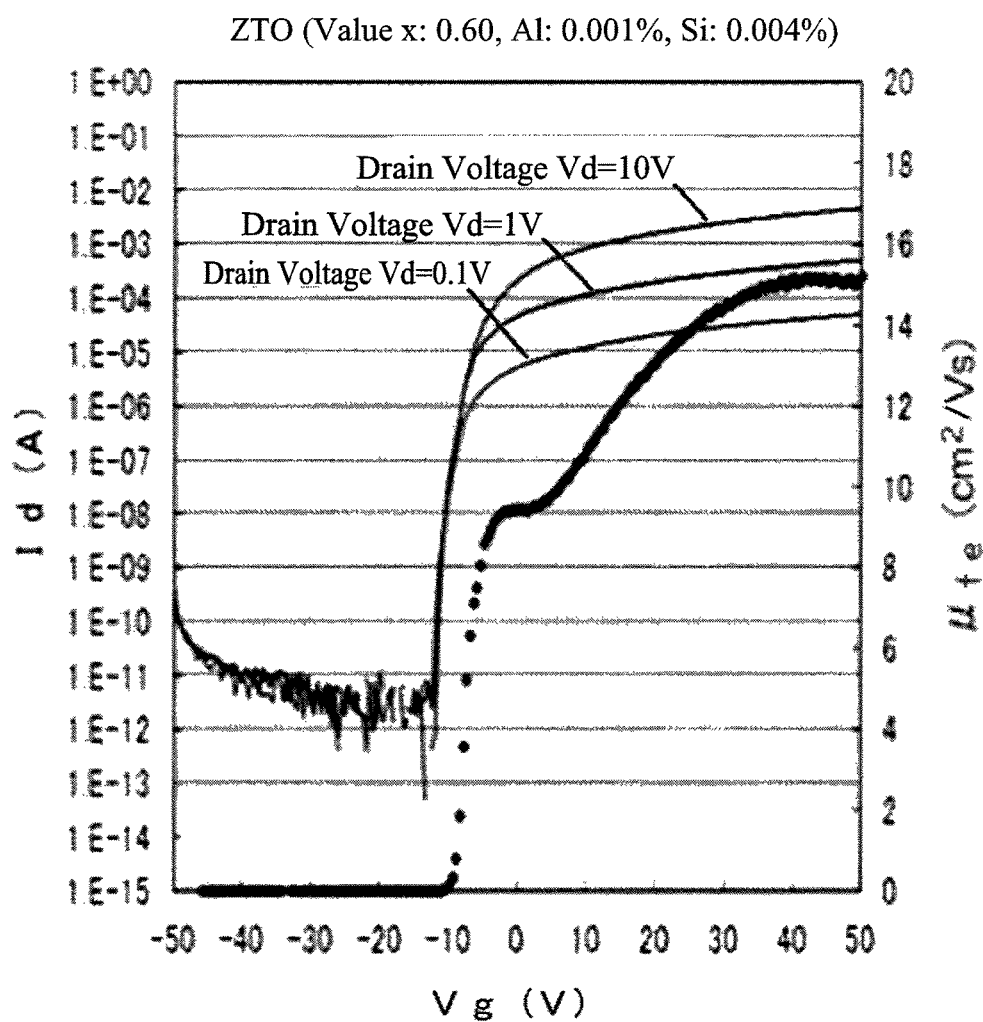
FIG. 3B illustrates Vg-Id characteristics of the thin film transistor sample including the comparative ZTO film (Al=0.001% by mass) after irradiation with ultraviolet light.
Figure 4B:
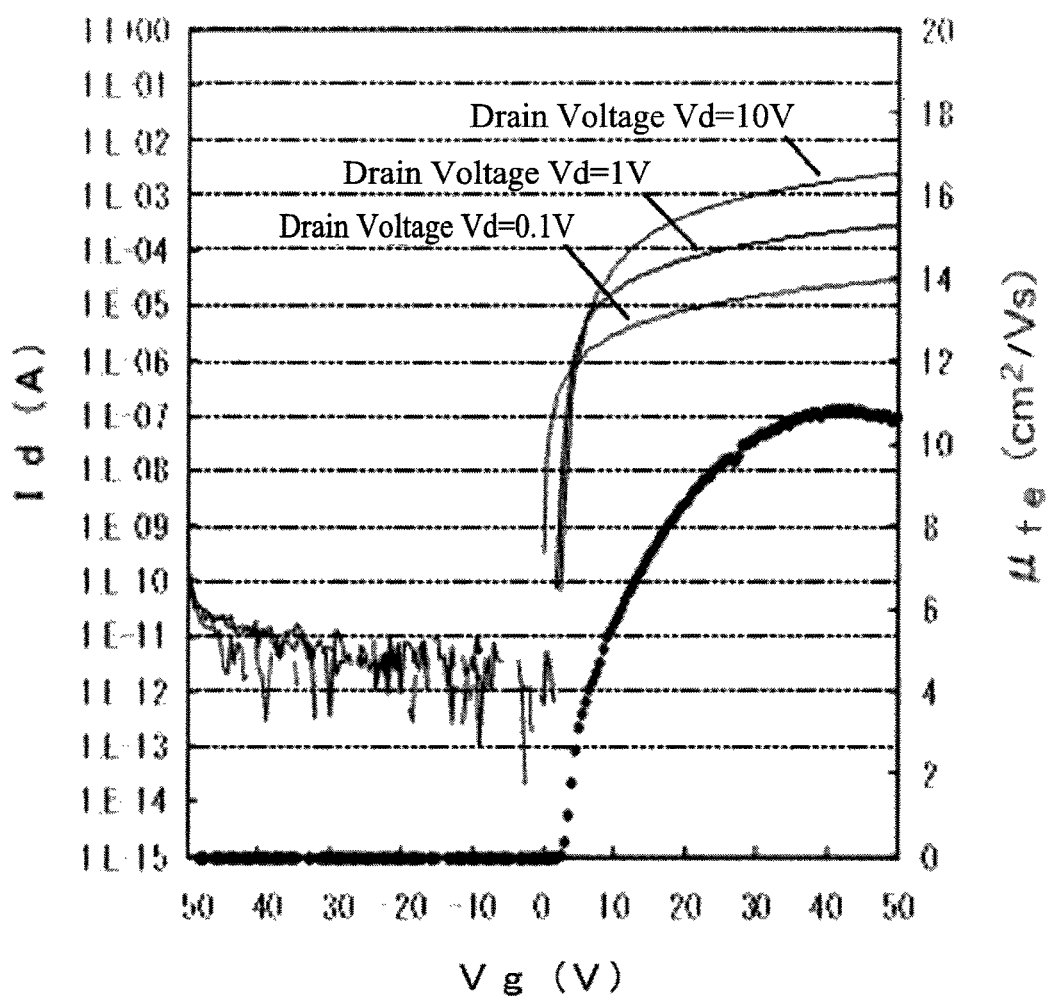
FIG. 4B illustrates Vg-Id characteristics of the thin film transistor sample including the ZTO film (Al=0.008% by mass) according to the invention after irradiation with ultraviolet light.
Figure 5A:
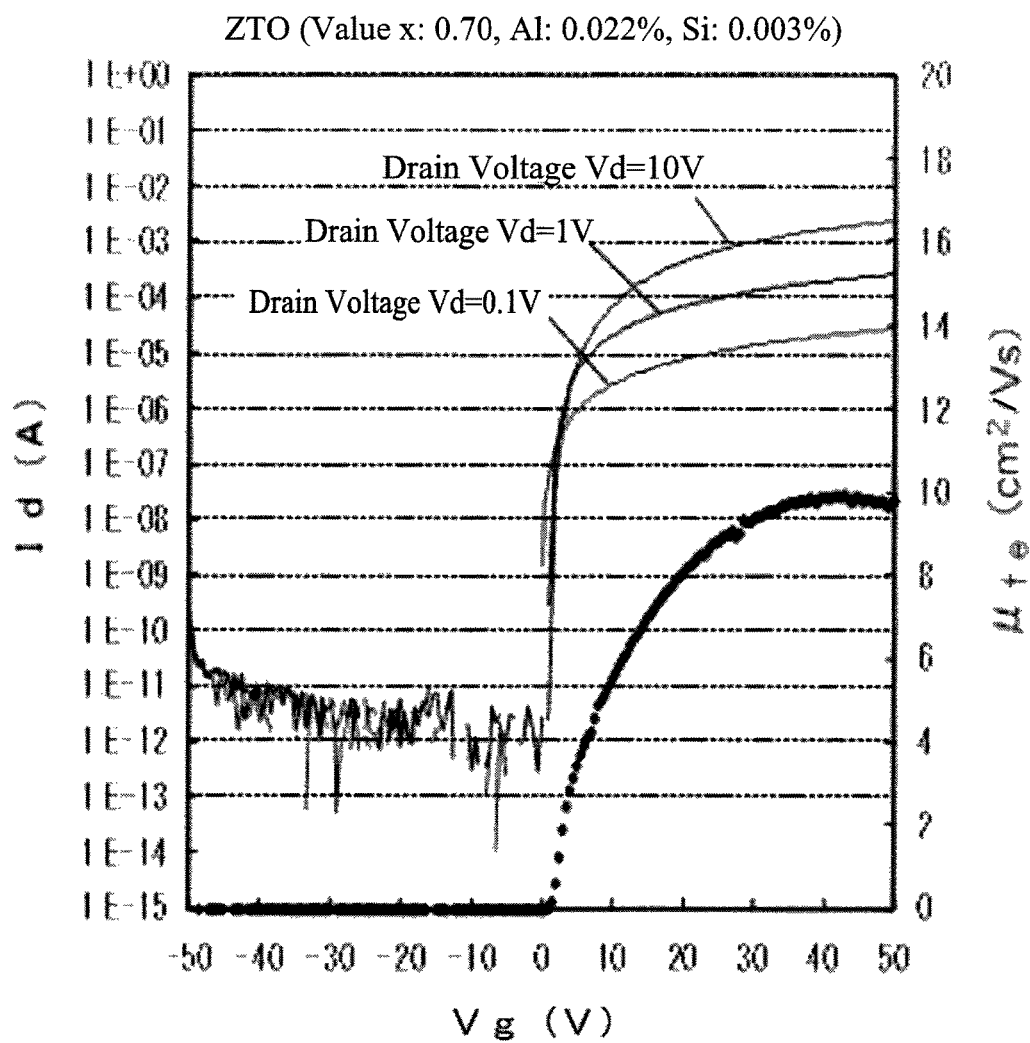
FIG. 5A illustrates Vg-Id characteristics of a thin film transistor sample including a ZTO film (Al=0.022% by mass) according to the invention before irradiation with ultraviolet light.
Figure 5B:
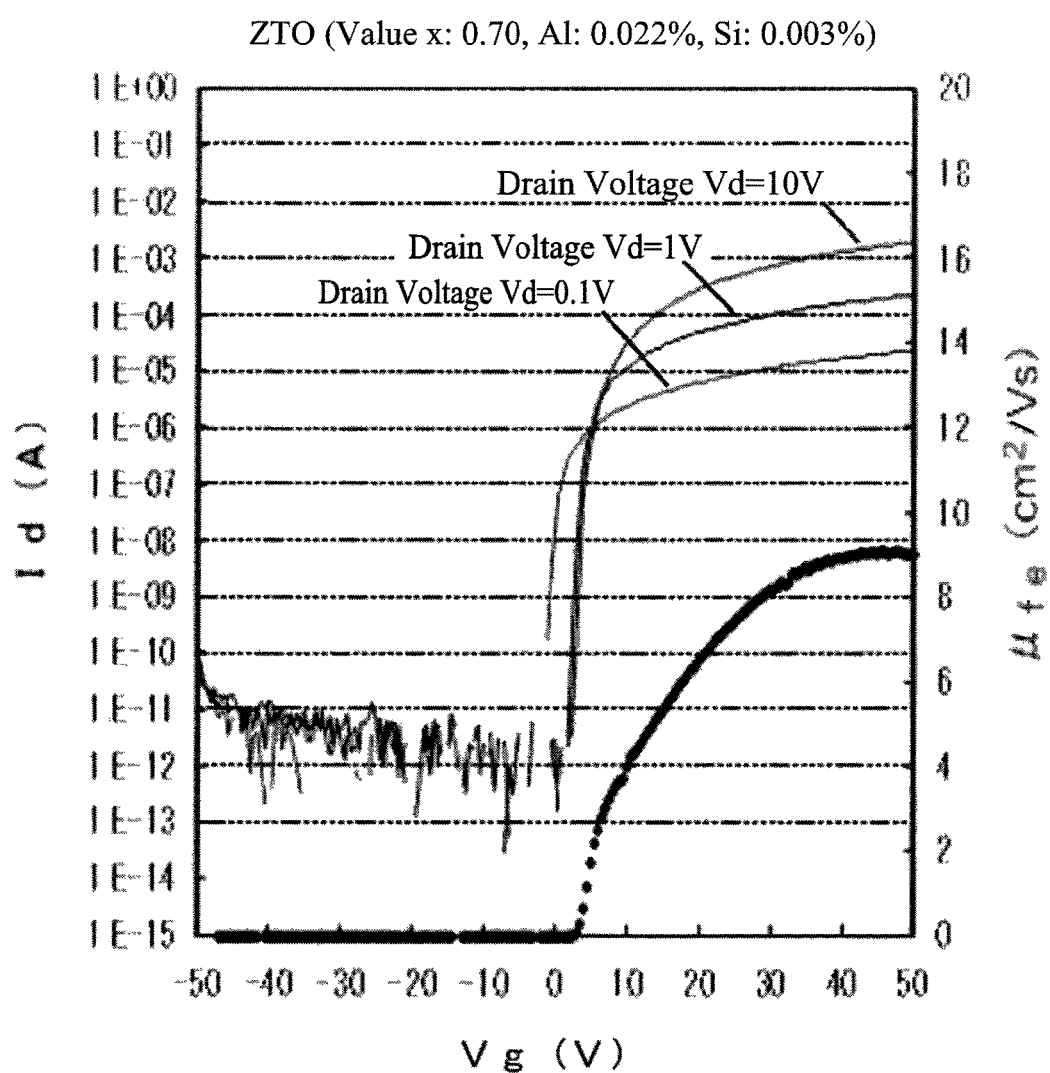
FIG. 5B illustrates Vg-Id characteristics of the thin film transistor sample including the ZTO film (Al=0.022% by mass) according to the invention after irradiation with ultraviolet light.
Figure 6A:
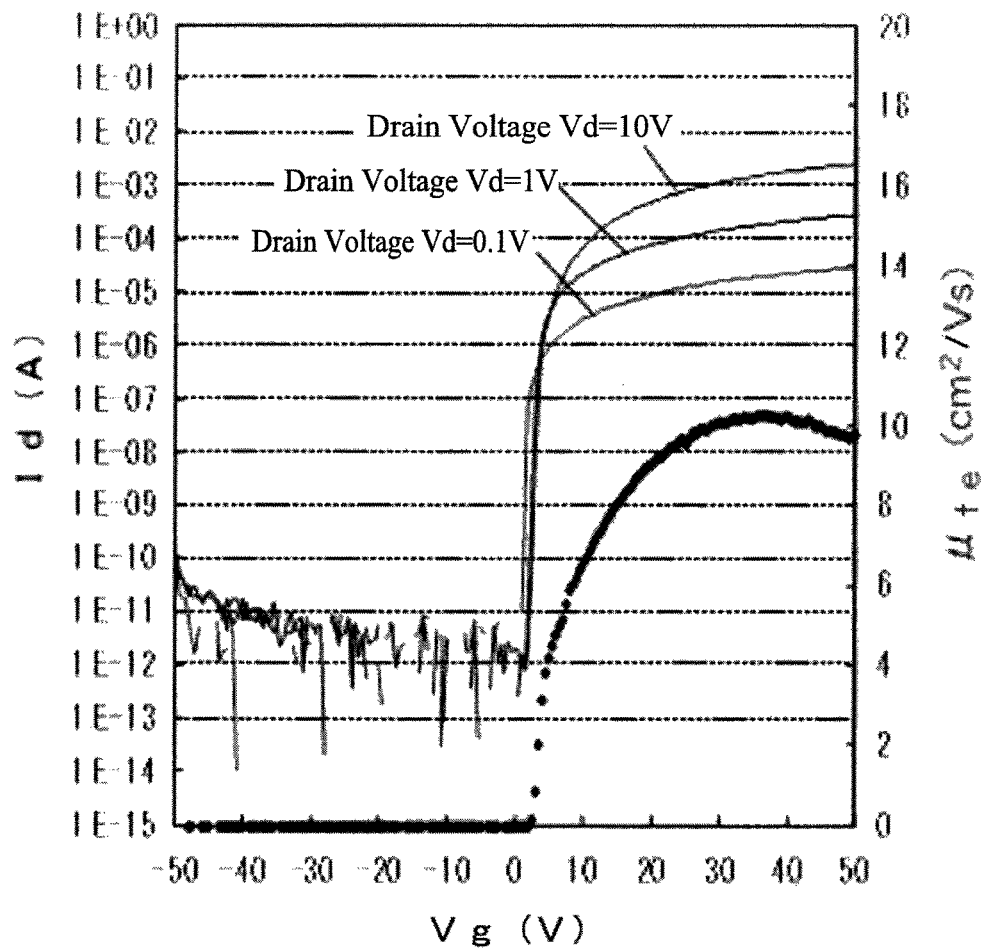
FIG. 6A illustrates Vg-Id characteristics of a thin film transistor sample including a ZTO film (Al=0.030% by mass) according to the invention before irradiation with ultraviolet light.
Figure 6B:
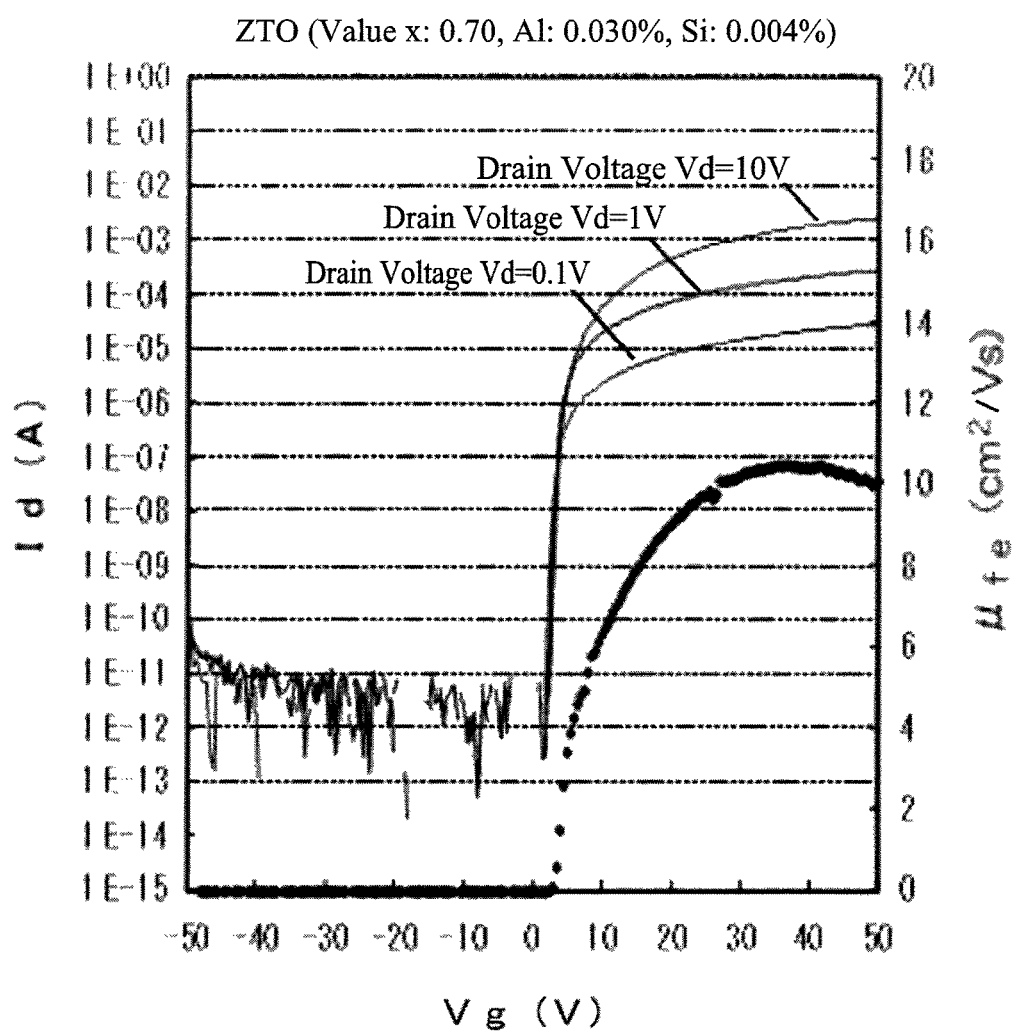
FIG. 6B illustrates Vg-Id characteristics of the thin film transistor sample including the ZTO film (Al=0.030% by mass) according to the invention after irradiation with ultraviolet light.
Figure 7A:
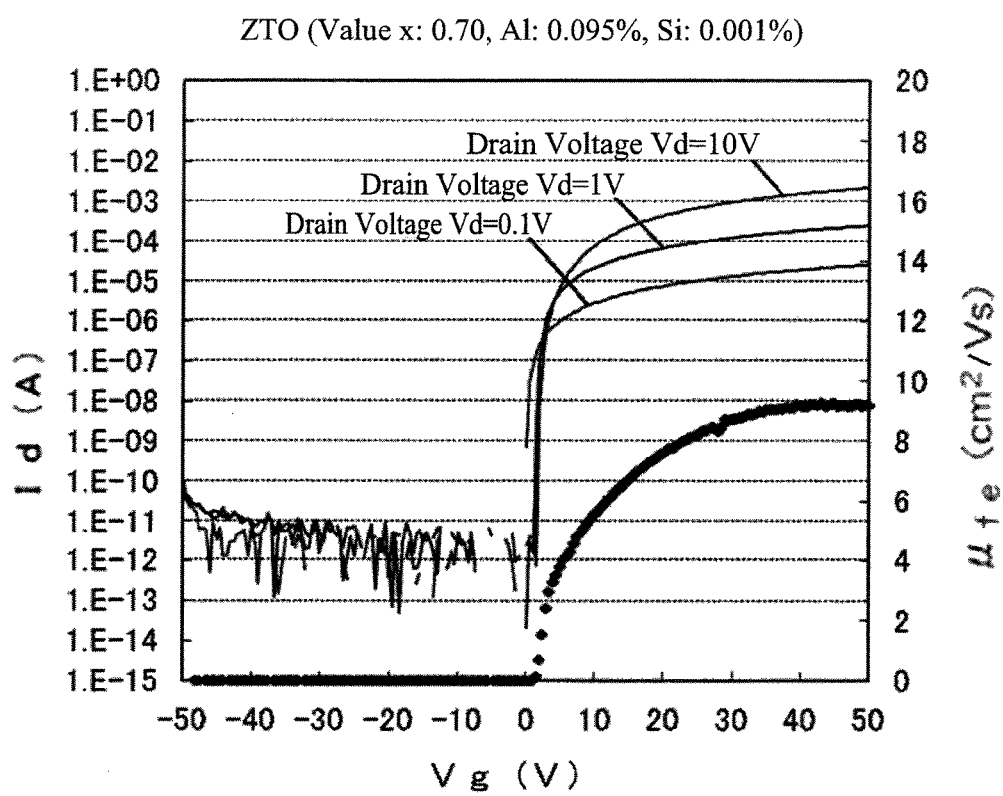
FIG. 7A illustrates Vg-Id characteristics of a thin film transistor sample including a ZTO film (Al=0.095% by mass) according to the invention before irradiation with ultraviolet light.
Figure 7B:
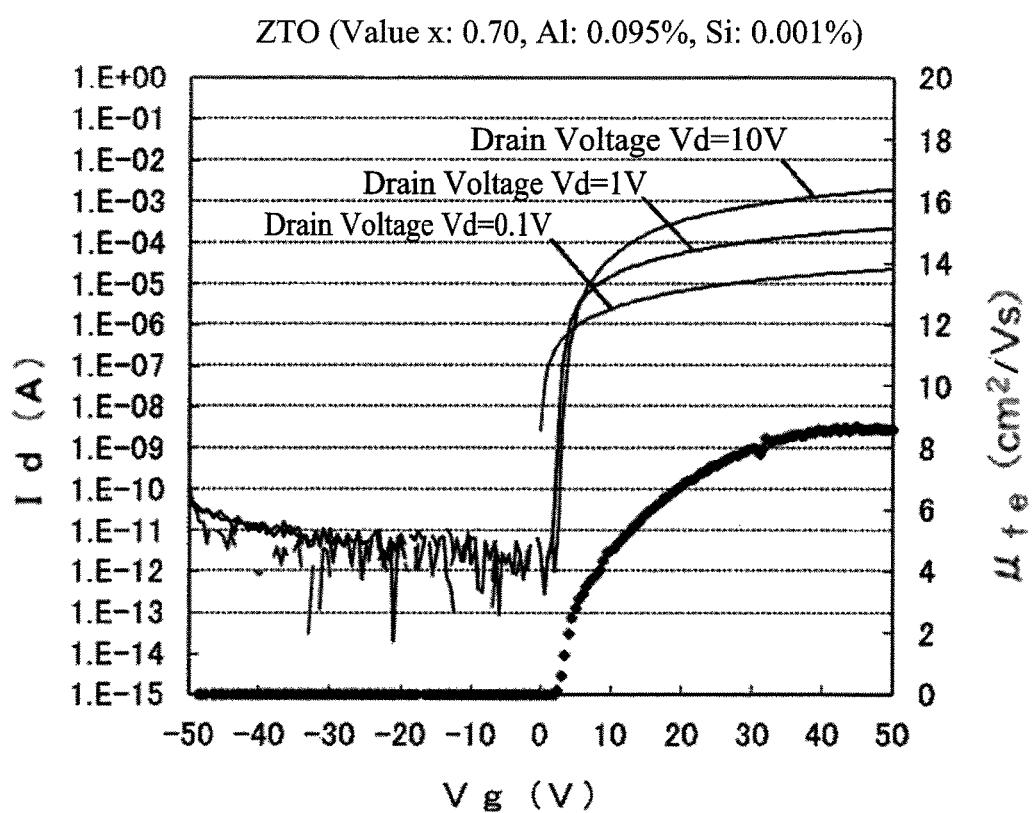
FIG. 7B illustrates Vg-Id characteristics of the thin film transistor sample including the ZTO film (Al=0.095% by mass) according to the invention after irradiation with ultraviolet light.
Figure 9A:
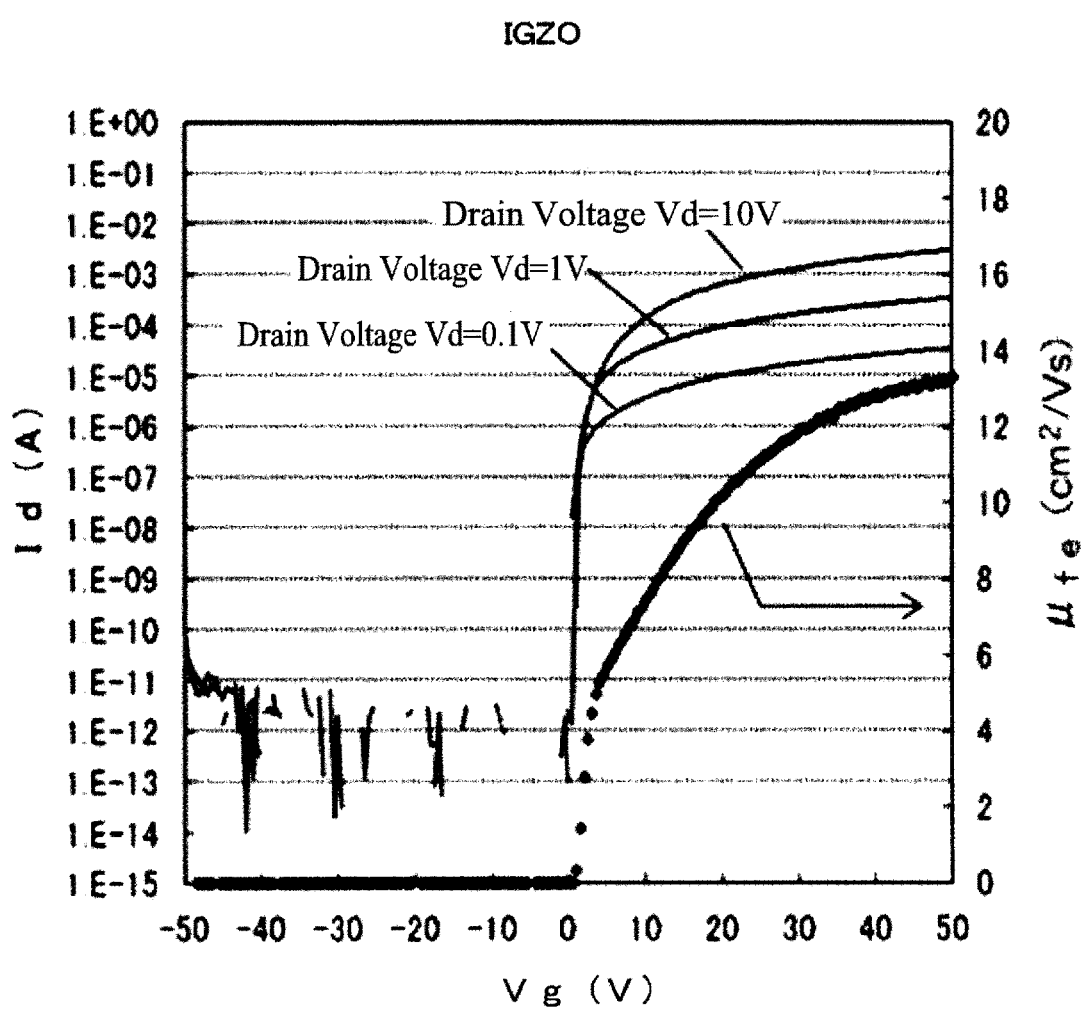
FIG. 9A illustrates Vg-Id characteristics of a thin film transistor sample including an IGZO film before irradiation with ultraviolet light.
Figure 9B:
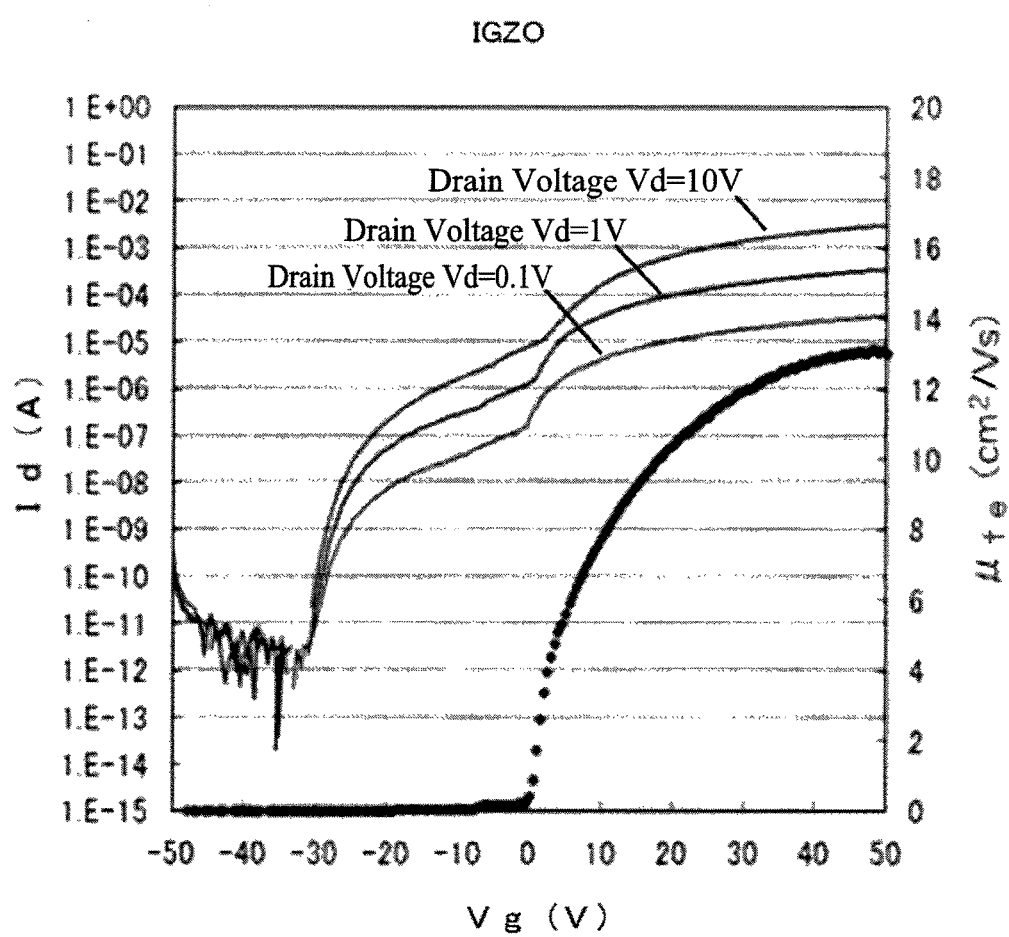
FIG. 9B illustrates Vg-Id characteristics of the thin film transistor sample including the IGZO film after irradiation with ultraviolet light.

| Target Material No. | Threshold voltage for the generation of a drain current in Vg-Id Characteristics [V] | | | Vg-Id Characteristics | Remarks |
|---|---|---|---|---|---|
| | Before Irradiation | After Irradiation | Change | | |
| 5 | 2 | −30.5 | −32.5 | FIG. 9A FIG. 9B | Comparative Example |
| 8 | 0.2 | −8.8 | −9 | FIG. 3A FIG. 3B | Comparative Example |
| 9 | 2.5 | 4 | 1.5 | FIG. 4A FIG. 4B | Example |
| 10 | 3 | 3.2 | 0.2 | FIG. 5A FIG. 5B | Example |
| 11 | 3.1 | 3.9 | 0.8 | FIG. 6A FIG. 6B | Example |
| 12 | 2.6 | 3.5 | 0.9 | FIG. 7A FIG. 7B | Example |

TABLE 4-continued

Figure 8A:
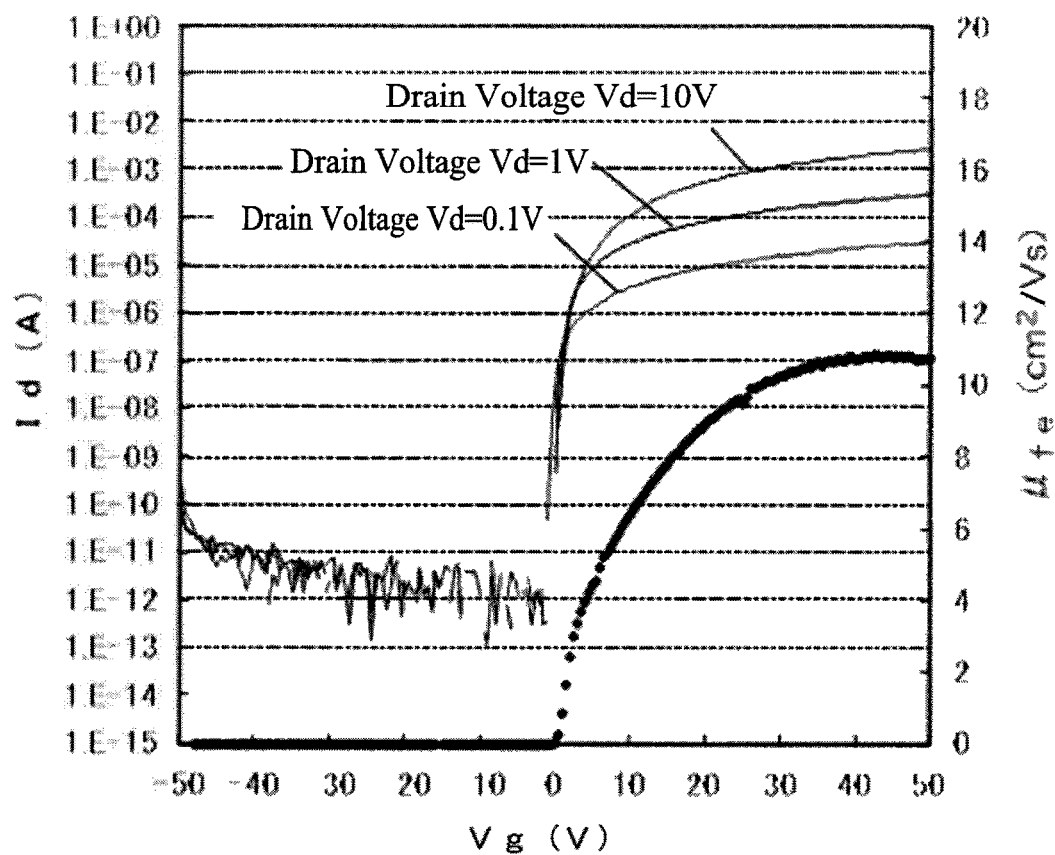
FIG. 8A illustrates Vg-Id characteristics of a thin film transistor sample including a comparative ZTO film (Al=0.090% by mass) before irradiation with ultraviolet light.
Figure 8B:
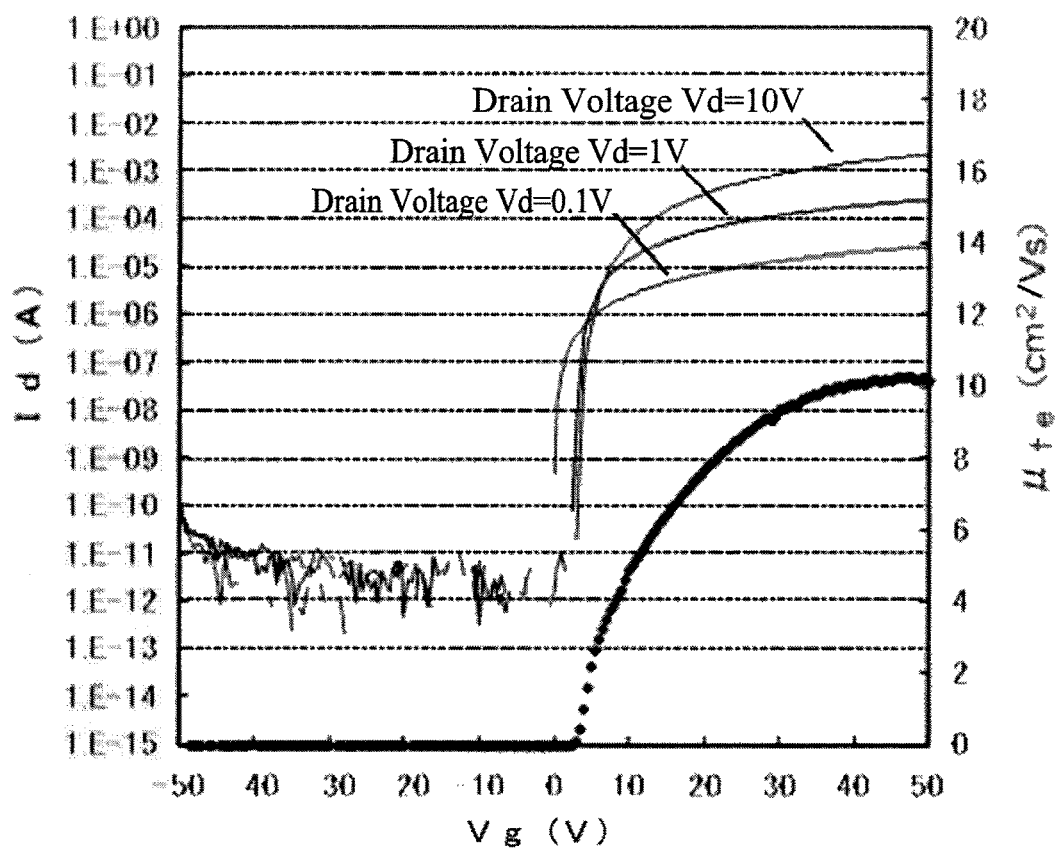
FIG. 8B illustrates Vg-Id characteristics of the thin film transistor sample including the comparative ZTO film (Al=0.090% by mass) after irradiation with ultraviolet light.

| Target | Threshold voltage for the generation of a drain current in Vg-Id Characteristics [V] | | | | |
|---|---|---|---|---|---|
| Material No. | Before Irradiation | After Irradiation | Change | Vg-Id Characteristics | Remarks |
| 13 | 1.6 | 4.3 | 2.7 | FIG. 8A FIG. 8B | Comparative Example |
| 14 | 2.3 | 3.7 | 1.4 | — | Example |

*Ultraviolet light irradiation time was 1 hour only for No. 10, and 30 minutes for the others As demonstrated in Table 4, and FIG. 4B, FIG. 5B, FIG. 6B, and FIG. 7B, it is found that target materials Nos. 9, 10, 11, 12, and No. 14 (not illustrated), which are examples according to the invention, had excellent resistance to ultraviolet light, as understood from the change in the threshold voltage for the generation of a drain current before the ultraviolet light irradiation to after the ultraviolet light irradiation within a preferred range of from zero to +1.5 V. In particular, the change was within a more preferred range of from zero to +1.0 V in target materials Nos. 10, 11, and 12, which are examples according to the invention. In addition, in a comparative example (thin film transistor sample 13 obtained using target material No. 13) in which a ZTO film containing silicon at a fairly higher content of 0.030% by mass than the other ZTO films is provided as the channel layer, the amount of change (shift amount) in the threshold voltage for the generation of a drain current from before the ultraviolet light irradiation to after the ultraviolet light irradiation was +2.7 V; this is in the plus range, but somewhat large.

In contrast, a comparative example (thin film transistor sample 5 obtained using target material No. 5) including an IGZO film as the channel layer and a comparative example (thin film transistor sample 8 obtained using target material No. 8) in which a ZTO film containing aluminum in a smaller amount than the range (0.005% by mass to 0.2% by mass) specified in the invention is provided as the channel layer, a change in the threshold voltage for the generation of a drain current from before the ultraviolet light irradiation to after the ultraviolet light irradiation greatly shifted toward negative voltage range.

Target material No. 14 had an aluminum content that is approximately 1.8 times that of No. 12 and No. 13, and had a total amount of aluminum and silicon that is approximately 1.4 times that of No. 13. It was found that thin film transistor sample 14 including a ZTO film obtained using target material No. 14 with a higher aluminum content in ZTO than the other ZTO films also has excellent resistance to ultraviolet light, as understood from a change in the threshold voltage for the generation of a drain current in a preferred range of from zero to +1.5V through the ultraviolet light irradiation as demonstrated in Table 4, although the Vg-Id characteristics are not illustrated in the drawings.

Figure 11:
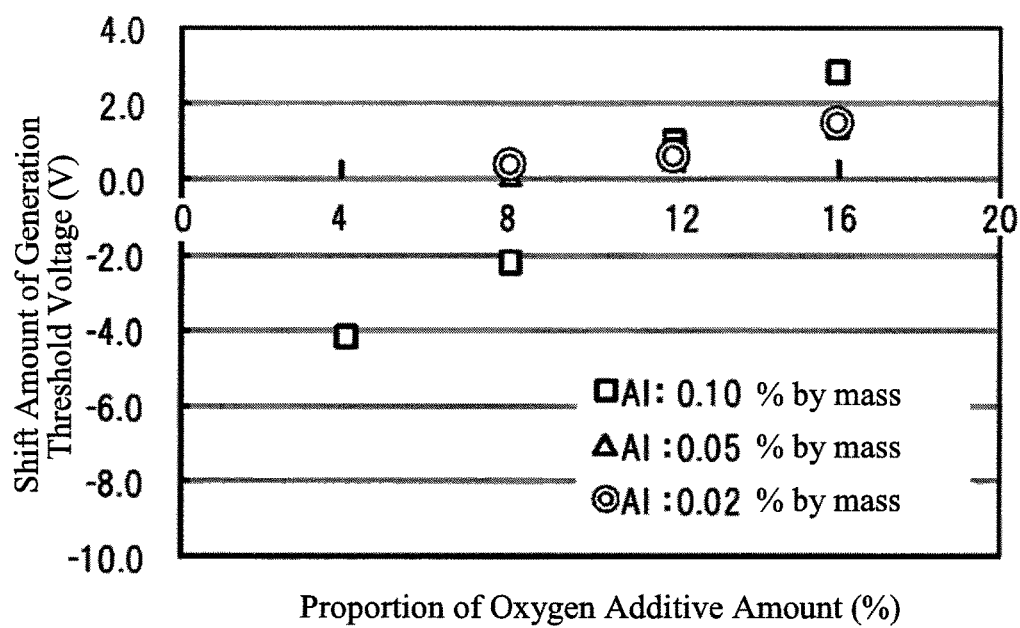
FIG. 11 is a diagram illustrating the relationship among the content of aluminum in ZTO, the proportion of oxygen added in forming a film by DC sputtering, and the shift of the generation threshold voltage in TFT characteristics caused by irradiation of ultraviolet light.

In relation to this result, for example, FIG. 11 illustrates a result of examination of the relationship among the content of aluminum, the proportion (%) of the amount of oxygen added in the sputtering gas during deposition, and the shift amount (V) of the generation threshold voltage caused by ultraviolet light irradiation, obtained using a ZTO with a value x of 0.70. From this result, it is found that an increase in the content of aluminum in ZTO has a tendency to cause an increase in the shift amount of the generation threshold voltage, depending on conditions of oxygen addition during deposition by a magnetron sputtering method. Accordingly, it is conceivable that the Vg-Id characteristics easily fluctuate depending on, for example, the deposition equipment or oxygen addition conditions during deposition. However, the proportion of added oxygen in the sputtering gas used for the formation of the oxide semiconductor film is generally within the range of from 1% to 15%, and use is possible as long as there is a condition in which the shift amount of the generation threshold voltage can be regulated to be from zero to +2.0 V, preferably from zero to +1.5 V, within the oxygen proportion range described above.

While resistance to ultraviolet light irradiation is described in the present example, it is suggested that the oxide semiconductor film according to the invention has a resistance to irradiation of visible light having wavelengths corresponding to photon energy that is equivalent to the bandgap (approximately 3.0 to 3.6 eV) of ZTO, which is similar to the resistance to ultraviolet light, in consideration of the mechanism thought to be the cause of deterioration of Vg-Id characteristics.

The disclosure of Japanese Patent Application No. 2013-084253 is incorporated by reference herein in its entirety.

All of the publications, patent applications, and technical standards described in this specification are incorporated herein by reference to the same extent as if each individual publication, patent application, or technical standard was specifically and individually indicated to be incorporated by reference.

The invention claimed is:

1. An oxide semiconductor target comprising an oxide sintered body including zinc, tin, oxygen, aluminum and silicon,
    wherein a total content of aluminum and silicon is 0.1% by mass or less with respect to a total mass of the oxide sintered body,
    wherein a content of aluminum is greater than or equal to 0.005% by mass with respect to the total mass of the oxide sintered body,
    wherein a content of silicon with respect to the total mass of the oxide sintered body is less than 0.03% by mass,
    wherein the content of silicon does not exceed the content of aluminum, and
    wherein an atomic ratio (Zn/(Zn+Sn)) of zinc to a total amount of zinc (Zn) and tin (Sn) is from more than 0.52 to 0.8.

2. The oxide semiconductor target according to claim 1, wherein the content of silicon is from 0.001% by mass to 0.02% by mass with respect to the total mass of the oxide sintered body.

3. A method of manufacturing an oxide semiconductor film, the method comprising: forming an oxide semiconductor film on a substrate by a sputtering method using the oxide semiconductor target according to claim 1.

4. An oxide semiconductor film formed using the oxide semiconductor target according to claim 1.

5. A thin film transistor comprising a channel layer formed using the oxide semiconductor film of claim 4, a change from a threshold voltage for generation of drain current before irradiation of light to a threshold voltage for generation of drain current after irradiation of light in the thin film transistor being from 0 V to +2.0 V.

6. The thin film transistor according to claim 5, wherein the change is from 0 V to +1.5 V.

* * * * *

UNITED STATES PATENT AND TRADEMARK OFFICE
CERTIFICATE OF CORRECTION

PATENT NO. : 9,837,543 B2
APPLICATION NO. : 14/783435
DATED : December 5, 2017
INVENTOR(S) : Hiroyuki Uchiyama et al.

It is certified that error appears in the above-identified patent and that said Letters Patent is hereby corrected as shown below:

On the Title Page

"(72) Inventors: Hiroyuki Uchiyama, Yasugi (EP);" should read:
"(72) Inventors: Hiroyuki Uchiyama, Yasugi (JP);"

Signed and Sealed this
Twenty-second Day of January, 2019

Andrei Iancu
*Director of the United States Patent and Trademark Office*